US008233092B2

(12) United States Patent
Mino

(10) Patent No.: US 8,233,092 B2
(45) Date of Patent: Jul. 31, 2012

(54) VIDEO SIGNAL PROCESSING DEVICE

(75) Inventor: Atsushi Mino, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 869 days.

(21) Appl. No.: 12/292,250

(22) Filed: Nov. 14, 2008

(65) Prior Publication Data

US 2009/0128692 A1    May 21, 2009

(30) Foreign Application Priority Data

Nov. 21, 2007  (JP) ................................. 2007-302195

(51) Int. Cl.
*H03M 1/12* (2006.01)
(52) U.S. Cl. ........ 348/572; 348/537; 348/538; 348/539; 348/573
(58) Field of Classification Search .................. 348/572, 348/537, 538, 539, 547–550, 573
See application file for complete search history.

(56) References Cited

U.S. PATENT DOCUMENTS

| 4,746,996 A | * | 5/1988 | Furuhata et al. | 386/201 |
| 5,294,987 A | * | 3/1994 | Saeger et al. | 348/536 |
| 5,442,406 A | * | 8/1995 | Altmanshofer et al. | 348/588 |
| 5,744,991 A | * | 4/1998 | Jefferson et al. | 327/158 |
| 5,767,916 A | * | 6/1998 | West | 348/537 |
| 5,790,612 A | * | 8/1998 | Chengson et al. | 375/373 |
| 6,008,859 A | * | 12/1999 | Ito et al. | 348/540 |
| 6,310,653 B1 | * | 10/2001 | Malcolm et al. | 348/537 |
| 6,556,249 B1 | * | 4/2003 | Taylor et al. | 348/497 |
| 6,959,062 B1 | * | 10/2005 | Stubbs | 375/376 |
| 7,010,074 B2 | * | 3/2006 | Nakamura | 375/371 |
| 7,453,971 B2 | * | 11/2008 | Lu | 375/371 |
| 7,719,529 B2 | * | 5/2010 | Anderson et al. | 345/213 |
| 7,995,144 B2 | * | 8/2011 | Clynes et al. | 348/554 |
| 2002/0054238 A1 | * | 5/2002 | Kunio | 348/537 |
| 2002/0135705 A1 | * | 9/2002 | Nakatsuji et al. | 348/806 |
| 2006/0170823 A1 | * | 8/2006 | FanChiang et al. | 348/536 |
| 2006/0274199 A1 | * | 12/2006 | Satoh et al. | 348/500 |
| 2007/0153126 A1 | * | 7/2007 | Sonobe | 348/537 |

FOREIGN PATENT DOCUMENTS

JP    A-2006-115113    4/2006

* cited by examiner

*Primary Examiner* — Jefferey Harold
*Assistant Examiner* — Humam Satti
(74) *Attorney, Agent, or Firm* — Oliff & Berridge, PLC

(57) ABSTRACT

Provided is a video signal processing device capable of judging the viability of phase locking at a PLL circuit and, in accordance with the judgment, automatically switching between the PLL circuit and a DLL circuit to use to generate a sampling clock of an input analog video signal, the device including an AD converter for AD converting an analog video signal, and a clock signal generating circuit for supplying a clock signal to the AD converter. The clock signal generating circuit includes: a PLL circuit for generating a first clock signal on the basis of a horizontal synchronous signal acquired from the analog video signal; a DLL circuit for generating a second clock signal on the basis of a composite synchronous signal acquired from the analog video signal; and a clock selecting portion for selecting and outputting either the first clock signal or the second clock signal on the basis of output of a PLL-dedicated phase comparator.

8 Claims, 19 Drawing Sheets

VIDEO SIGNAL PROCESSING DEVICE

This application is based on an application No. 2007-302195 filed in Japan, the contents of which are hereby incorporated by reference.

BACKGROUND OF THE INVENTION

1. Field of the Invention

The present invention relates to a video signal processing device including an analog/digital converter for converting an analog video signal into a digital video signal and a clock signal generating circuit for supplying clock signals to the analog/digital converter.

2. Description of the Related Art

Audio devices, navigation devices, and the like mount therein video signal processing devices that convert analog video signals input from a plurality of kinds of devices such as radio wave receiving devices and DVD players into digital video signals, and cause the digital video signals to be displayed on the display portions of liquid crystal displays and the like.

Video signal processing devices mount therein PLL (Phase-Locked Loop) circuits and DLL (Delay-Locked Loop) circuits such that clock signals generated in the PLL circuits or the DLL circuits are used as sampling clocks for converting analog video signals input to the devices into digital video signals.

The PLL circuit includes a voltage control oscillator (VCO) that carries out feedback by generating a clock signal of a predetermined frequency on the basis of a phase difference and a frequency difference between a feedback signal and a frequency-controlled horizontal synchronous signal separated from the input analog video signal, and generates a clock signal synchronized with the horizontal synchronous signal.

The DLL circuit is provided with a reference oscillator and a plurality of delay circuits instead of the voltage control oscillator (VCO) and generates a clock signal with its edges aligned with those of a composite synchronous signal separated from the input analog video signal.

When the input analog video signal is a standard signal, which satisfies a television signal standard such as the NTSC system, or when the input analog video signal is a signal capable of being phase locked by the PLL circuit on the basis of a horizontal synchronous signal separated from the input analog video signal, then the clock signal generated at the PLL circuit is used as a sampling clock.

This is because sampling the input analog video signal on the basis of the clock signal generated at the PLL circuit results in a more beautiful video display with reduced jitters than sampling on the basis of the clock signal generated at the DLL circuit.

However, when the input analog video signal is a non-standard signal, which deviates from a television signal standard, or when the input analog video signal is a signal incapable of being phase locked by the PLL circuit on the basis of a horizontal synchronous signal separated from the input analog video signal, then the clock signal generated at the DLL circuit is used as a sampling clock.

In view of this, in the conventional video signal processing devices, either the PLL circuit or the DLL circuit was selected uniformly depending on the kind of the signal generating source of the input analog video signal, and the selected clock signal was supplied as the sampling clock signal to the analog/digital converter.

For example, when the signal generating source of the input analog video signal input to the video signal processing device was a radio wave receiving device or a DVD player, the clock signal generated at the PLL circuit was selected as the sampling clock, while when the signal generating source was a VHS video cassette recorder, the clock signal generated at the DLL circuit was selected as the sampling clock.

This is because although the radio wave receiving device and the DVD player output a standard signal satisfying the television signal standard, the VHS video cassette recorder highly possibly outputs a non-standard signal deviating from the television signal standard if the recorder carries out a playback operation with an expanded or contracted video tape, since video tapes used for playback operations of the recorder may be expanded or contracted due to repeated use, temperature properties, and the like. This may disable the phase locking by the PLL circuit.

Japanese Unexamined Patent Publication No. 2006-115113 discloses a clock generation apparatus capable of shifting only the phase of the sampled video signal when a synchronous signal and a video signal are input separately.

Specifically, the clock generation apparatus includes: a first ADC for inputting and digitizing a synchronous signal or a video signal on which a synchronous signal is superimposed and outputting the digitized signal; a second ADC for inputting and digitizing a video signal and outputting the digitized signal; a PLL circuit for generating a clock on the basis of a horizontal synchronous signal separated from the output signal from the first ADC and supplying the clock to the first ADC; a DLL circuit for delaying the clock output from the PLL circuit to output multiple-phase clocks; and a clock selection circuit for selecting one of the input multiple-phase clocks and supplying the selected clock to the second ADC.

However, the video signal processing devices adapted to make a proper use of the PLL circuit and the DLL circuit in generating sampling clocks depending on the kind of the signal generating source of the input analog video signal may pose the following problems.

First, for the video signal processing device to switch between the PLL circuit and the DLL circuit to supply a clock signal to the analog/digital converter, the kind of the signal generating source of the input analog video signal must be identified, thereby necessitating a dedicated circuit.

Next, although using the clock signal of the PLL circuit generally results in a more beautiful video display with reduced jitters, the video cassette recorder uniformly uses the clock signal of the DLL circuit, resulting in video degradation in quality.

There are cases where the phase locking by the PLL circuit is possible depending on the state of the recording medium, such as video tape, used in the playback operation of the video cassette recorder. In such cases, selecting the clock signal of the PLL circuit results in a more beautiful video display.

Contrarily, even in the case of a signal generating source of a standard signal where the clock signal of the PLL circuit is selected, the phase locking by the PLL circuit may be disabled by the influence of the environment and the like, resulting in a video distortion.

In this case, there is a case where selecting the clock signal of the DLL circuit results in a normal video display.

SUMMARY OF THE INVENTION

In view of the foregoing problems, an object of the present invention is to provide a video signal processing device capable of judging the viability of the phase locking at the PLL circuit and, in accordance with the judgment, automatically switching between the PLL circuit and the DLL circuit to use to generate a sampling clock of the input analog video signal.

In order to accomplish the above object, a video signal processing device according to the present invention includes: a PLL circuit for generating a first clock signal on the basis of a horizontal synchronous signal acquired from an analog video signal; a DLL circuit for generating a second clock signal on the basis of a composite synchronous signal acquired from the analog video signal; a clock selecting portion for selecting and outputting either the first clock signal or the second clock signal on the basis of a phase difference output from a PLL-dedicated phase comparator provided in the PLL circuit; and an analog/digital converter for converting the analog video signal into a digital video signal on the basis of the clock signal selected by the clock selecting portion.

The present invention will become more apparent in the detailed description of the preferred embodiments presented below.

DESCRIPTION OF THE PREFERRED EMBODIMENTS

A video signal processing device according to a first embodiment of the present invention will be described below.

Figure 1:
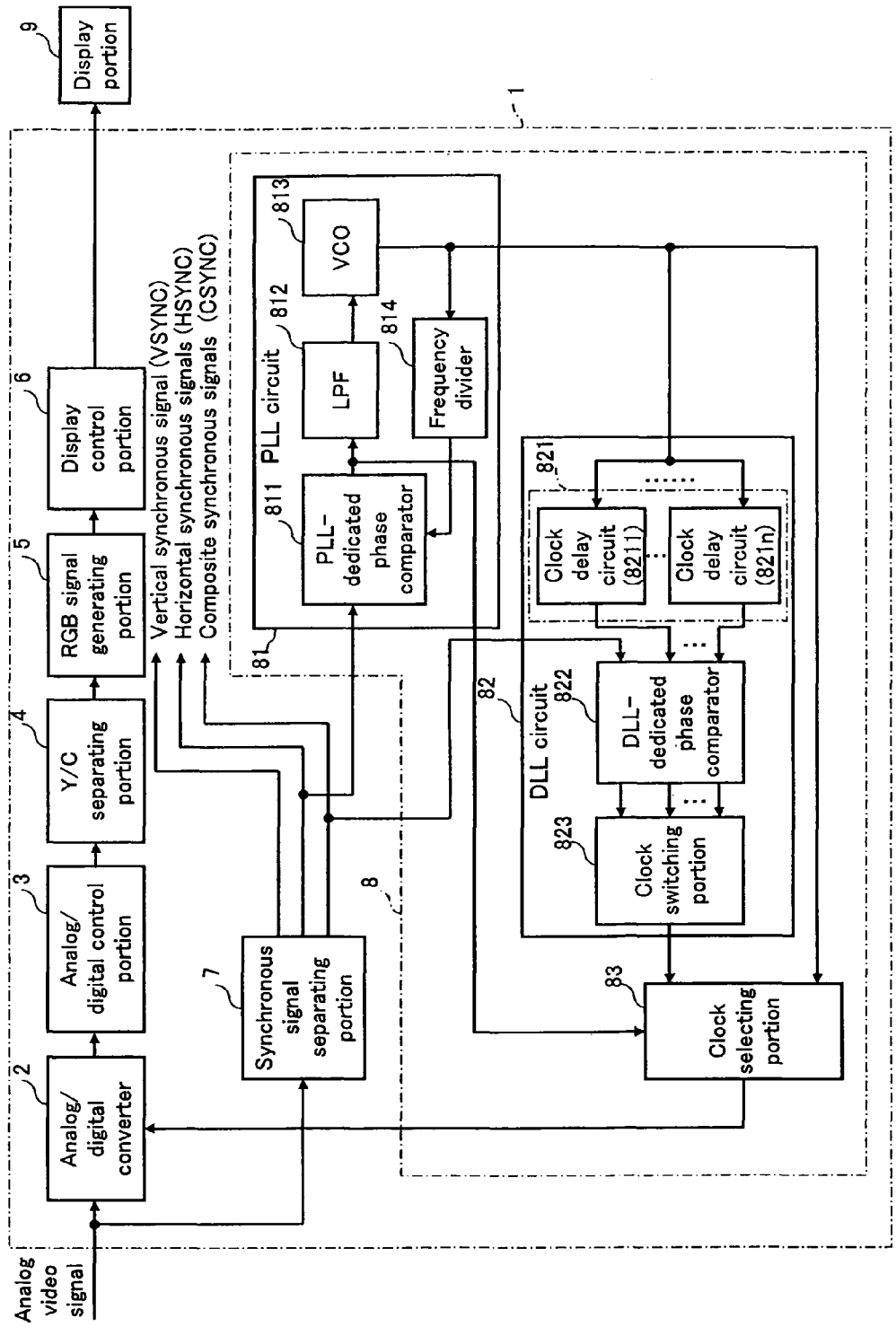
FIG. 1 is a functional block diagram of a video signal processing device according to a first embodiment of the present invention.

Referring to FIG. 1, a video signal processing device 1 includes an analog/digital converter 2, an analog/digital control portion 3, a Y/C separating portion 4, an RGB signal generating portion 5, a display control portion 6, a synchronous signal separating portion 7, and a clock signal generating circuit 8.

The analog/digital converter 2 is a block for converting an analog video signal into a digital video signal. The Y/C separating portion 4 is a block for separating an output signal from the analog/digital control portion 3 into a luminance signal and a color signal. The analog/digital control portion 3 is a block for functioning as an interface circuit between the analog/digital converter 2 and the Y/C separating portion 4.

The RGB signal generating portion 5 is a block for generating an RGB signal on the basis of the luminance signal and the color signal separated by the Y/C separating portion 4. The display control portion 6 carries out control to display a video image on a display portion 9 composed of a liquid crystal display and the like.

The synchronous signal separating portion 7 is a block for separating and outputting a horizontal synchronous signal, a vertical synchronous signal, and a composite synchronous signal from an input analog video signal. The clock signal generating circuit 8 is a block for generating a sampling clock signal supplied to the analog/digital converter 2.

The analog/digital converter 2 converts the input analog video signal into a digital video signal by sampling and holding the input analog video signal in synchronism with the rise or fall of the clock signal supplied from the clock signal generating circuit 8.

The analog video signal input to the analog/digital converter 2 is one of the analog video signals output from a plurality of kinds of signal generating sources such as radio wave receiving devices and DVD players, and the analog video signal is output from a signal generating source selected by a switching circuit serving as a source selecting portion.

The Y/C separating portion 4 includes a band pass filter that passes only a signal, among the output signals from the analog/digital control portion 3, that is in the vicinity of the frequency of a color subcarrier in order to output a color signal C, and a subtracter that subtracts the output of the band pass filter from the output signal from the analog/digital control portion 3 in order to output a luminance signal Y.

The RGB signal generating portion 5 includes a color signal demodulating portion that extracts two kinds of color difference signals, namely (B-Y) and (R-Y), on the basis of the color signal C, and a matrix portion that generates an RGB signal on the basis of the luminance signal Y and the color difference signals (B-Y) and (R-Y).

The display control portion 6 includes an operation control portion that carries out setting control of the display modes and the like of the display portion 9, a display outputting portion that displays the RGB signal on the screen of the display portion 9, and the like.

Figure 2:
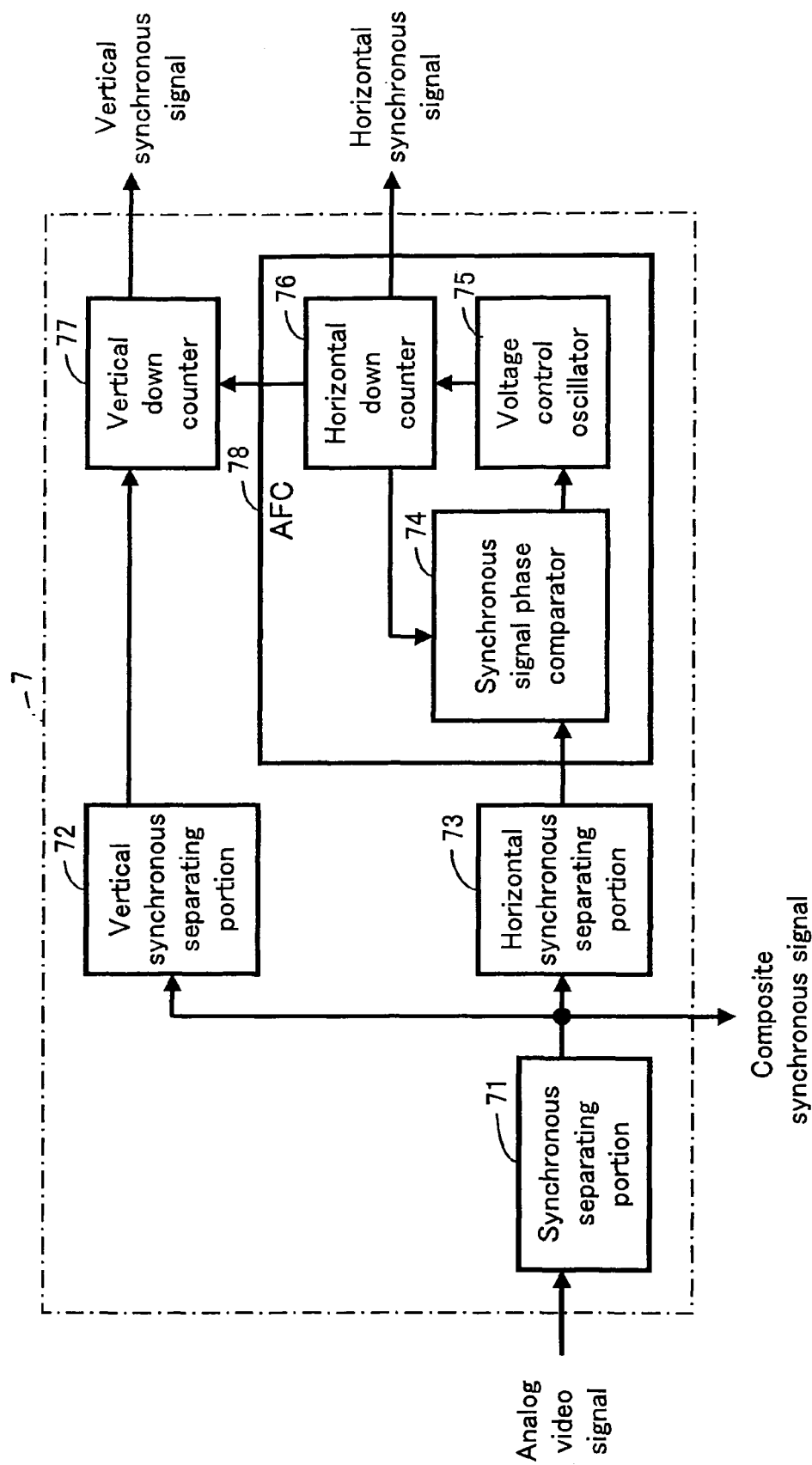
FIG. 2 is a functional block diagram of a synchronous signal separating portion.

Referring to FIG. 2, the synchronous signal separating portion 7 includes a synchronous separating portion 71, a vertical synchronous separating portion 72, a horizontal synchronous separating portion 73, a synchronous signal phase comparator 74, a voltage control oscillator 75, a horizontal down counter 76, and a vertical down counter 77.

The synchronous separating portion 71 separates a composite synchronous signal composed of a horizontal synchronous signal and a vertical synchronous signal from the analog video signal. The vertical synchronous separating portion 72 separates the vertical synchronous signal from the composite synchronous signal. The horizontal synchronous separating portion 73 separates the horizontal synchronous signal from the composite synchronous signal.

The synchronous signal phase comparator 74 compares the phases and frequencies of the horizontal synchronous signal output from the horizontal synchronous separating portion 73 and a feedback signal output from the horizontal down counter 76, and outputs a voltage corresponding to the phase difference.

The voltage control oscillator 75 generates a clock signal of a frequency corresponding to the value of the voltage output from the synchronous signal phase comparator 74 and outputs the clock signal to the horizontal down counter 76.

The horizontal down counter 76 outputs as a feedback signal (frequency-modulated horizontal synchronous signal) a clock signal that results from dividing the clock signal output from the voltage control oscillator 75 at a dividing ratio corresponding to a horizontal period count.

The vertical down counter 77 outputs as a vertical synchronous signal a clock signal that results from dividing the frequency of the horizontal synchronous signal divided by the horizontal down counter 76 at a dividing ratio corresponding to a vertical period count.

That is, the synchronous signal phase comparator 74, the voltage control oscillator 75, and the horizontal down counter 76 constitute an automatic frequency control circuit (AFC) 78, so that feedback control is carried out to make agree the phase difference of the horizontal synchronous signal input from the horizontal synchronous separating portion 73 and the clock signal input from the horizontal down counter 76.

Referring to FIG. 1, the clock signal generating circuit 8 includes a PLL circuit 81, a DLL circuit 82, and a clock selecting portion 83.

The PLL circuit 81 generates a first clock signal on the basis of a horizontal synchronous signal acquired from the analog video signal, e.g., a horizontal synchronous signal separated from the analog video signal by the synchronous signal separating portion 7 and controlled to a predetermined frequency by the AFC 78.

The DLL circuit 82 generates a second clock signal on the basis of a composite synchronous signal acquired from the analog video signal, e.g., a composite synchronous signal separated from the analog video signal by the synchronous signal separating portion 7.

The clock selecting portion 83 selects either the first clock signal or the second clock signal on the basis of output of a PLL-dedicated phase comparator 811 provided in the PLL circuit 81, and outputs the selected signal to the analog/digital converter 2 as a sampling clock.

To the PLL circuit 81, a stable synchronous signal is desirably input. To the DLL circuit 82, a raw synchronous signal separated from the input analog video signal is desirably input in a direct manner.

In view of this, in FIG. 1, to the PLL circuit 81, a horizontal synchronous signal frequency-controlled by the AFC 78 is input, and to the DLL circuit 82, a raw composite synchronous signal separated from the input analog video signal is input.

The PLL circuit 81 includes the PLL-dedicated phase comparator 811 for calculating a phase difference and outputting a signal of a voltage level corresponding to the phase difference, a low pass filter (LPF) 812 for removing a high frequency component out of the signal output from the PLL-dedicated phase comparator 811, a voltage control oscillator (VCO) 813 for calculating a frequency on the basis of the signal output from the LPF 812 and outputting a first clock signal of the calculated frequency, and a frequency divider 814 for dividing the first clock signal output from the VCO 813.

The PLL-dedicated phase comparator 811 calculates a phase difference between the horizontal synchronous signal output from the horizontal down counter 76 of the synchronous signal separating portion 7 and the first clock signal output from the VCO 813 and divided by the frequency divider 814, and increases or decreases the voltage level of the signal output to the LPF 812 on the basis of the lag or lead of the phase of the first clock signal with respect to the horizontal synchronous signal.

That is, the PLL circuit 81 carries out feedback control to make the phase difference agree.

The DLL circuit 82 includes a plurality of clock delay circuits 821 (821*l* to 821*n*) for delaying the first clock signal output from the PLL circuit 81 for different periods of time, and includes a DLL-dedicated phase comparator 822 for comparing the phases of the output of each of the clock delay circuits 821 and the composite synchronous signal output from the synchronous signal separating portion 7, and a clock switching portion 823 for outputting, as the second clock signal, output of a clock delay circuit 821 of a minimum phase difference indicated by the DLL-dedicated phase comparator 822.

The clock delay circuits 821 each include, for example, a different number of buffer circuits serving as delay circuits, and the buffer circuits are connected in series in each of the clock delay circuits 821. That is, the clock delay circuits 821 each delay the first clock signal for a period of time corresponding to the number of the provided buffer circuits and output the delayed first clock signal. It is also possible to extract a signal from each of the taps of the plurality of buffer circuits connected in series, so that a plurality of clock signals of different delayed periods of time are obtained.

The DLL-dedicated phase comparator 822 calculates the phase difference between the composite synchronous signal output from the synchronous separating portion 71 of the synchronous signal separating portion 7 and each of the signals output from the clock delay circuits 821, and outputs the calculated phase differences to the clock switching portion 823.

The clock switching portion 823 includes a switching circuit for selecting a smallest phase difference from the phase differences calculated by the DLL-dedicated phase comparator 822 and outputting the smallest phase difference.

With the above configuration, the first clock signal output from the PLL circuit 81 is used as a reference signal input to each of the clock delay circuits 821, thereby eliminating the need for additionally providing an oscillating circuit for generating the reference signal.

The clock selecting portion 83 is set to select the second clock signal when there are a predetermined number of consecutive horizontal synchronous signals having a phase difference, which is output from the PLL-dedicated phase comparator 811, equal to or more than a first threshold value T1*th*, and to select the first clock signal when there are a predetermined number of consecutive horizontal synchronous signals having a phase difference of equal to or less than a second threshold value T2*th*, which is smaller than the first threshold value T1*th*.

The PLL-dedicated phase comparator provided in the PLL circuit compares the phases of the horizontal synchronous signal and the frequency-divided signal fed back on the basis of the first clock signal.

When the phase difference, which is an output from the PLL-dedicated phase comparator, is small, that is, when the phase locking by the PLL circuit is viable, then the clock selecting portion selects the first clock signal generated by the PLL circuit as a sampling clock of the analog/digital converter, regardless of the signal generating source of the analog video signal input to the video signal processing device.

When the phase difference is large, that is, when the phase locking by the PLL circuit is impossible, then the clock selecting portion selects the second clock signal generated by the DLL circuit as a sampling clock of the analog/digital converter, regardless of the signal generating source of the analog video signal input to the video signal processing device.

Figure 3A:
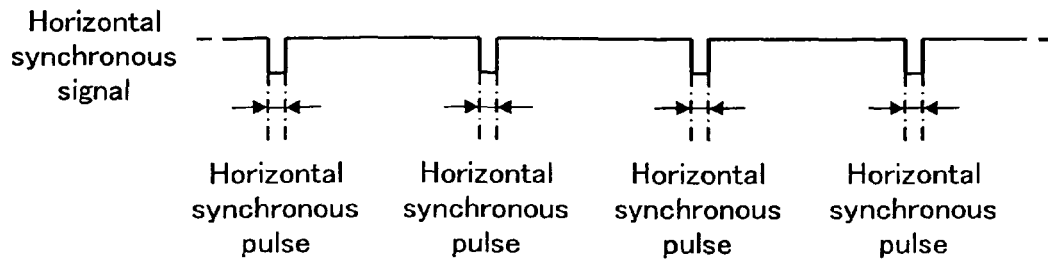
FIG. 3A is a time chart for illustrating a horizontal synchronous signal.

This will be described in detail below. The horizontal synchronous signal is a signal having a pulse (horizontal synchronous pulse) as shown in, for example, FIG. 3A at a starting timing of each of the scanning lines.

The first clock signal is a clock signal generated by the PLL circuit 81 on the basis of a horizontal synchronous signal subjected to automatic frequency control. In the case of a phase-locked state, the first clock signal has an extremely small phase difference with respect to the horizontal synchronous signal, but when the horizontal synchronous signal is in disorder, the phase difference with respect to the clock signal becomes large.

The PLL-dedicated phase comparator 811 outputs a signal of a voltage level corresponding to a phase difference t on a scanning line basis, and the clock selecting portion 83 grasps the phase difference t on the basis of the output signal from the PLL-dedicated phase comparator 811 and, in accordance with the degree of the phase difference t, switches between the first clock signal output from the PLL circuit 81 and the second clock signal output from the DLL circuit 82 to output to the analog/digital converter 2.

While the first clock signal is selected, the clock selecting portion 83 switches the first clock signal to the second clock signal in the following manner, for example.

Figure 3B:
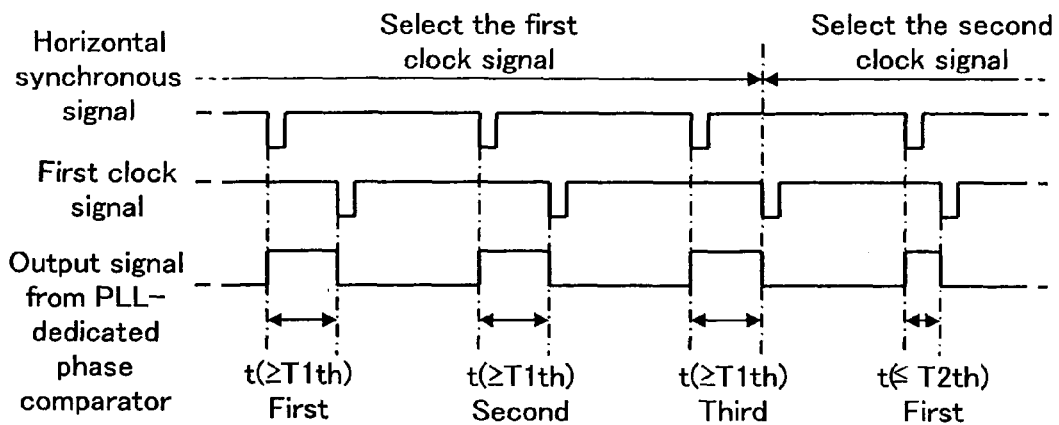
FIG. 3B is a time chart for illustrating the case where a first clock signal is switched to a second clock signal.

Referring to FIG. 3B, when the phase difference t calculated by the PLL-dedicated phase comparator 811 is equal to or more than the first threshold value T1*th* consecutively for predetermined times (three times in FIG. 3B), the clock selecting portion 83 switches the first clock signal to the second clock signal.

Figure 3C:
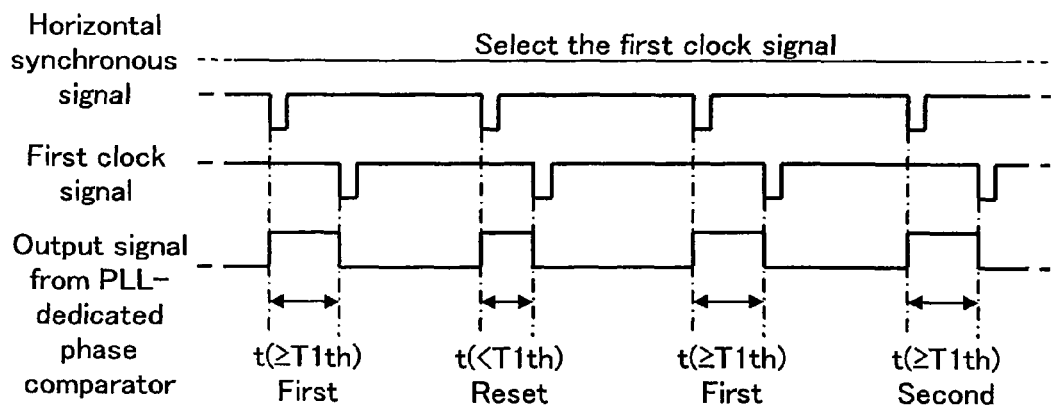
FIG. 3C is a time chart for illustrating the case where the first clock signal is not switched to the second clock signal.

Referring to FIG. 3C, when the phase difference t calculated by the PLL-dedicated phase comparator 811 becomes less than the first threshold value T1*th* before meeting the value for the above predetermined times (the second example in FIG. 3C being less than the first threshold value T1*th*), the clock selecting portion 83 keeps the first clock signal selected.

While the second clock signal is selected, the clock selecting portion 83 switches the second clock signal to the first clock signal in the following manner, for example.

Figure 4A:
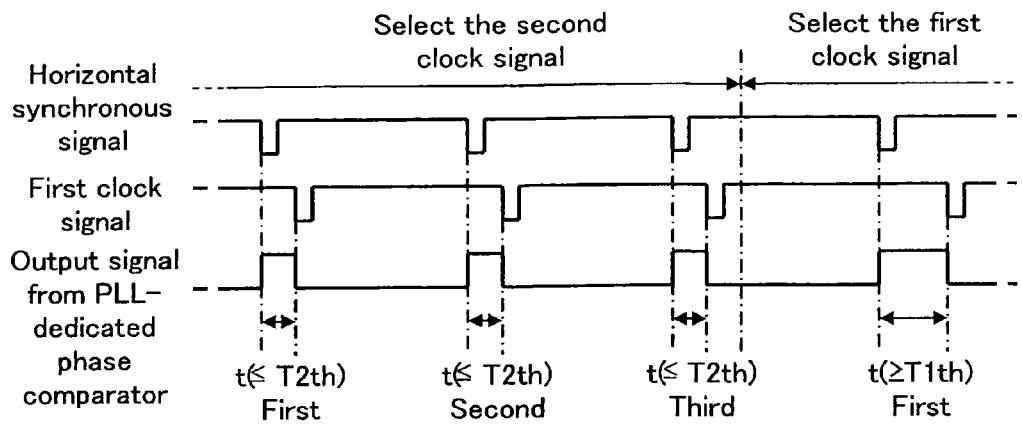
FIG. 4A is a time chart for illustrating the case where the second clock signal is switched to the first clock signal.

Referring to FIG. 4A, when the phase difference t calculated by the PLL-dedicated phase comparator 811 is equal to or less than the second threshold value T2*th*, which is smaller than the first threshold value T1*th*, consecutively for predetermined times (three times in FIG. 4A), the clock selecting portion 83 switches the second clock signal to the first clock signal.

Figure 4B:
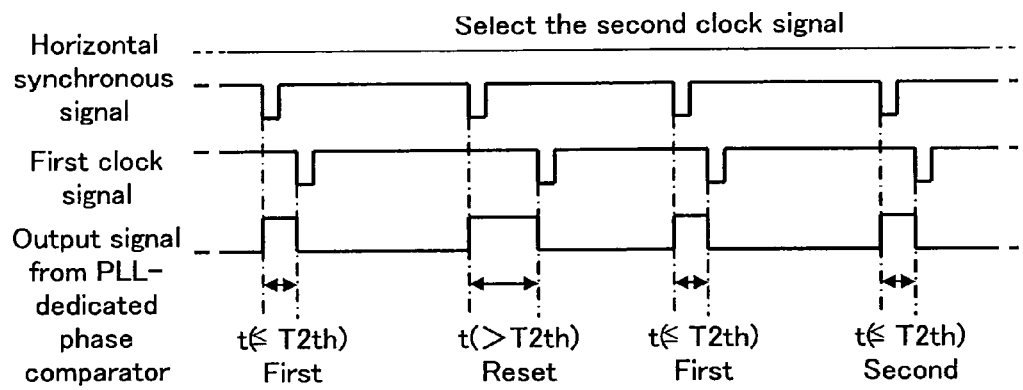
FIG. 4B is a time chart for illustrating the case where the second clock signal is not switched to the first clock signal.

Referring to FIG. 4B, when the phase difference t calculated by the PLL-dedicated phase comparator 811 becomes more than the second threshold value T2*th* before meeting the value for the above predetermined times (the second example in FIG. 4B being more than the second threshold value T2*th*), the clock selecting portion 83 keeps the second clock signal selected.

Making the values of the first threshold value T1*th* and the second threshold value T2*th* equal to one another may result in distortion of the video image displayed on the display portion 9 such that when the phase difference t output from the PLL-dedicated phase comparator 811 crosses beyond and below the threshold value, the clock selecting portion 83 frequently switches between the first clock signal and the second clock signal.

In view of this, setting the second threshold value T2*th* at a value smaller than the first threshold value T1*th* provides a hysteresis in order to prevent frequent switching between the clock signals.

Description will be made of the switching between the first clock signal and the second clock signal by the clock selecting portion 83 by referring to the flowchart shown in FIG. 5. It is noted that at the time of activation of the video signal processing device 1, the clock selecting portion 83 selects the first clock signal.

First, the clock selecting portion 83 resets a number counter, that is, sets it at "0" (SA1). The term "number counter" refers to a counter that counts the number of times for which the phase difference t is equal to or more than the first threshold value T1*th* while the first clock signal is selected or the phase difference t is equal to or less than the second threshold value T2*th* while the second clock signal is selected.

When a horizontal synchronous signal is input to the PLL circuit 81 (SA2), the PLL-dedicated phase comparator 811 outputs a phase difference t between the horizontal synchronous signal and a clock signal output from the frequency divider 814, and the clock selecting portion 83 compares the phase difference t with the first threshold value T1*th* (SA3).

When the phase difference t is equal to or more than the first threshold value T1*th* (SA3), the clock selecting portion 83 gives the number counter an increment (SA4), while when the phase difference t is less than the first threshold value T1*th*, the processing returns to step SA1 and the number counter is reset.

When the number counter indicates a value equal to or more than a predetermined value as a result of the above processing, that is, when the phase difference t is equal to or more than the first threshold value T1*th* consecutively on a plurality of scanning lines (SA5), then the clock selecting portion 83 switches the first clock signal to the second clock signal (SA6) and resets the number counter (SA7).

Then, when a horizontal synchronous signal is input to the PLL circuit 81 (SA8), the PLL-dedicated phase comparator 811 outputs a phase difference t between the horizontal synchronous signal and a clock signal output from the frequency divider 814, and the clock selecting portion 83 compares the phase difference t with the first threshold value T1*th* (SA9).

When the phase difference t is equal to or less than the second threshold value T2*th* (SA9), the clock selecting portion 83 gives the number counter an increment (SA10), while when the phase difference t is more than the second threshold value T2*th*, the processing returns to step SA7 and the number counter is reset.

When the number counter indicates a value equal to or more than a predetermined value as a result of the above processing, that is, when the phase difference t is equal to or less than the second threshold value T2*th* consecutively on a plurality of scanning lines (SA11), then the clock selecting portion 83 switches the second clock signal to the first clock signal (SA12) and resets the number counter (SA1).

The processing ends when no horizontal synchronous signal is input to the PLL circuit 81 in step SA2 or SA8.

It is also possible to judge whether to select the first clock signal or the second clock signal on a field basis.

A field changes to another on a vertical synchronous signal. That is, the vertical synchronous signal is a pulse signal that is output at a switching timing when a first field (odd-numbered field) is switched to a second field (even-numbered field), and at a switching timing when the second field (even-numbered field) is switched to a first field (odd-numbered field) of the next frame.

Inputting a vertical synchronous signal or a composite synchronous signal to the clock selecting portion 83 and resetting the number counter at a vertical synchronous timing enable the rest of the processing to be carried out regardless of the value counted up in the previous field.

Description will be made of, for example, the case where the state shown in FIG. 3B occurs over a plurality of fields.

When the vertical synchronous timing comes in the state where the phase difference t is equal to or more than the first threshold value T1*th* twice consecutively, then the clock selecting portion 83 resets the number counter. When thereafter the phase difference t in the case of the horizontal synchronous signal of the next field is equal to or more than the first threshold value T1*th*, the value on the number counter is 1, which prevents the first clock signal from being switched to the second clock signal at this time. The same applies to the case of switching the second clock signal to the first clock signal.

The above configuration prevents the switching of the clocks from being judged on the basis of a phase difference t calculated over different fields or frames.

Another embodiment of the present invention will be described below. While in the above embodiment the clock selecting portion 83 is configured to switch the clock signals when the phase difference t is equal to or more than the first threshold value T1*th* consecutively for predetermined times or equal to or less than the second threshold value T2*th* consecutively for predetermined times, as exemplified in FIGS. 3 and 4, the present invention is not necessarily limited to predetermined times of consecutiveness. The clock signals may be switched when the phase difference t is equal to or more than the first threshold value T1*th* or equal to or less than the second threshold value T2*th* on a plurality of scanning lines for predetermined times.

For example, a judgment as to whether the phase difference t is equal to or more than the first threshold value T1*th* may be carried out once for every predetermined number of scanning lines (e.g., once for every three scanning lines), and the second clock signal may be selected when the phase difference t is equal to or more than the first threshold value T1*th* consecutively for predetermined times (e.g., three times) only on the scanning lines subjected to judgment.

More specifically, when selecting the second clock signal in the case of nine scanning lines input to the PLL circuit 81, the clock selecting portion 83 may do so when the phase difference t is equal to or more than the first threshold value T1*th* consecutively for three times over the three scanning lines subjected to judgment (e.g., the third, sixth, and ninth scanning lines) among the nine scanning lines. On the other six scanning lines, which are not subjected to judgment, the phase difference t may not be equal to or more than the first threshold value T1*th*.

Also such a configuration is possible that the first clock signal is switched to the second clock signal when the phase difference t is equal to or more than the first threshold value T1*th* on equal to or more than a predetermined number of scanning lines among a whole number of scanning lines in a field, while when the phase difference t is equal to or less than the second threshold value T2*th* on equal to or less than a predetermined number of scanning lines, the second clock signal is switched to the first clock signal.

The threshold value for the number counter at which to switch the clock signals is not limited to 3 but may be set conveniently depending on the device. It is also possible to set differently the threshold value for the number counter in the case of switching the first clock signal to the second clock signal and the threshold value for the number counter in the case of switching the second clock signal to the first clock signal.

Figure 5:
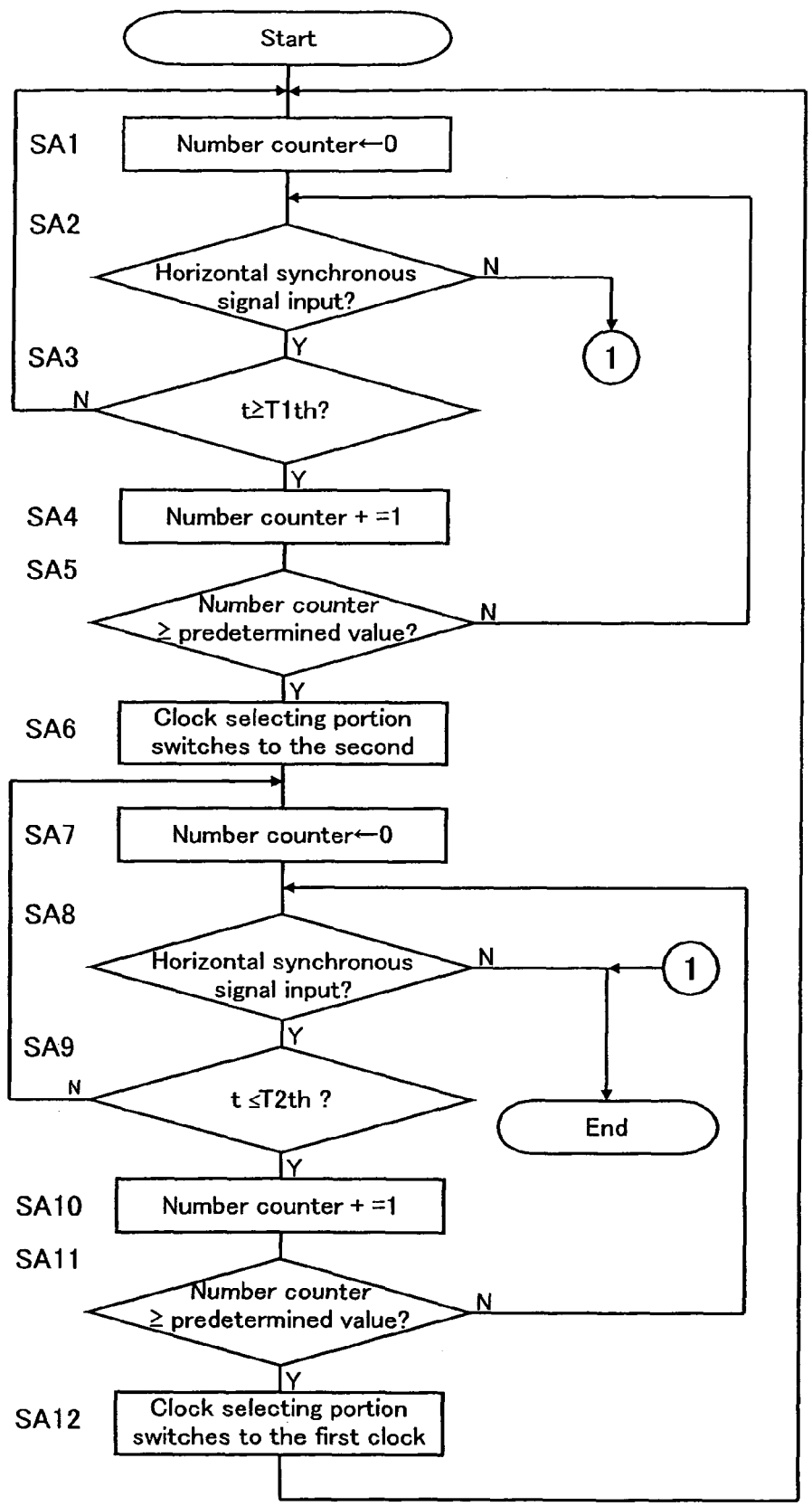
FIG. 5 is a flowchart for describing switching between the first clock signal and the second clock signal by a clock selecting portion.
Figure 6:
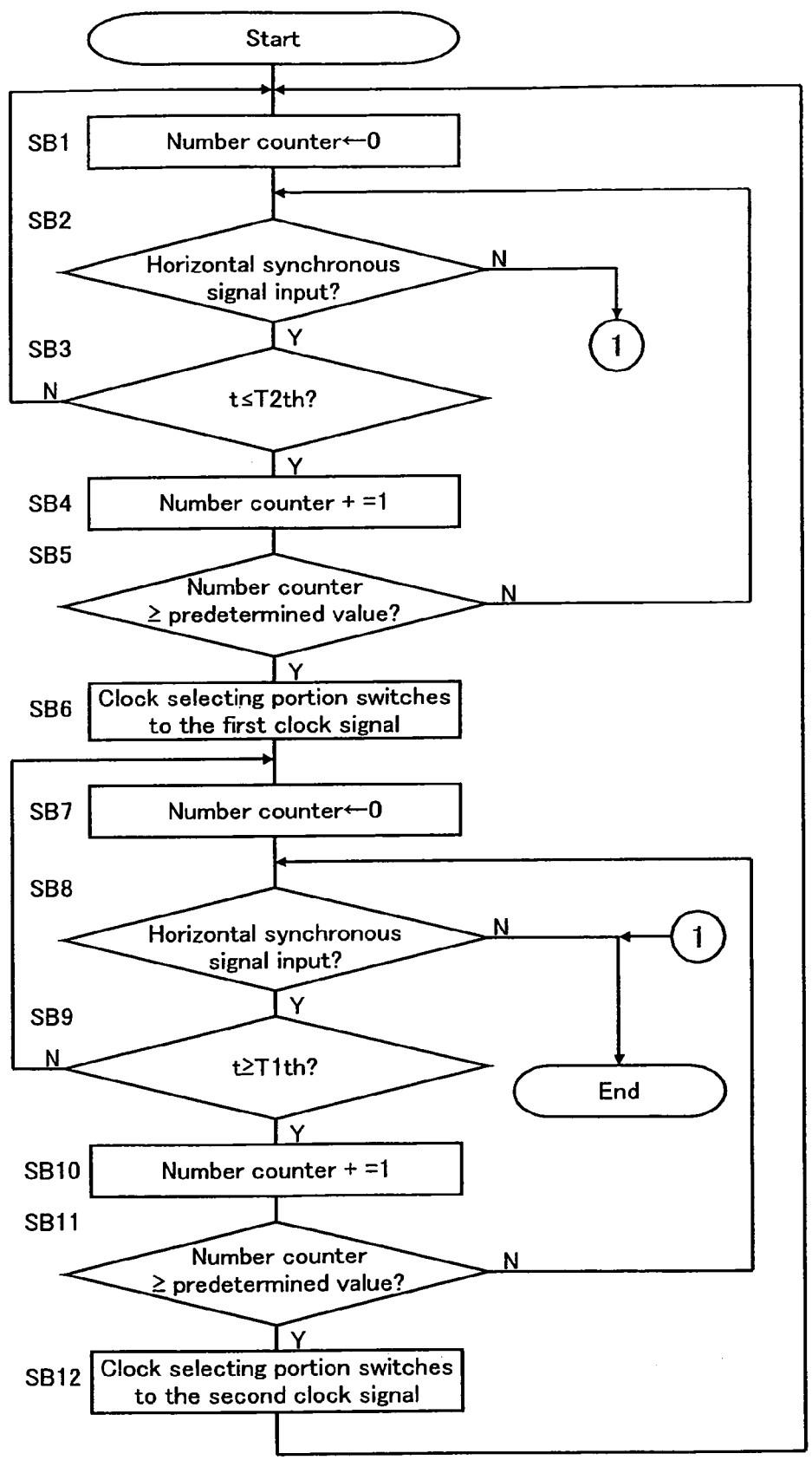
FIG. 6 is a flowchart for describing switching between the first clock signal and the second clock signal by the clock selecting portion while the second clock signal is initially set.

The flowchart shown in FIG. 5 exemplifies the case where the clock selecting portion 83 selects the first clock signal at the time of activation of the video signal processing device 1, while the processing represented by the flowchart shown in FIG. 6 is carried out when the clock selecting portion 83 selects the second clock signal at the time of activation of the video signal processing device 1.

It is also possible to set the clock signal selected by the clock selecting portion 83 to vary depending on the signal generating source of the analog video signal input to the video signal processing device 1.

For example, when the signal generating source is a VHS recorder and the like, the clock selecting portion 83 may initially select the second clock signal, while when the signal generating source is a radio wave receiving device, a DVD player, and the like, the clock selecting portion 83 may initially select the first clock signal.

While in the above embodiment description has been made to the case where the clock selecting portion 83 selects a clock signal on the basis of the phase difference t output from the PLL-dedicated phase comparator 811, the clock selecting portion 83 may select a clock signal on the basis of a phase difference output from the LPF 812 of the PLL circuit 81.

A video signal processing device according to a second embodiment of the present invention will be described below. The second embodiment relates to the above-described clock selecting portion. In the following description, the same parts as those in the first embodiment are denoted by the same reference characters. A detailed description thereof will not be repeated.

Figure 7:
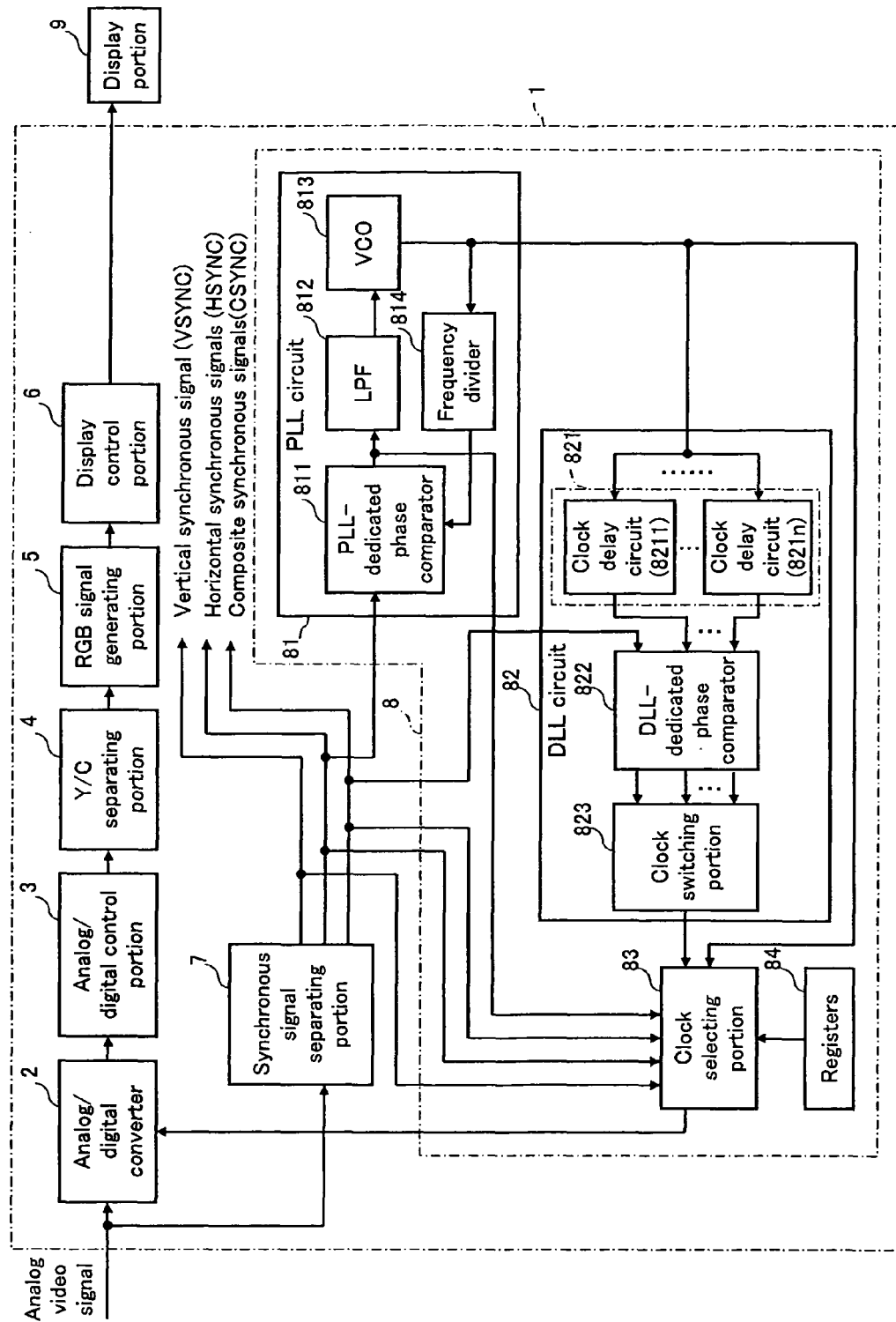
FIG. 7 is a functional block diagram of a video signal processing device according to a second embodiment of the present invention.

Referring to FIG. 7, the video signal processing device 1 includes functional blocks including the analog/digital converter 2, the analog/digital control portion 3, the Y/C separating portion 4, the RGB signal generating portion 5, the display control portion 6, the synchronous signal separating portion 7, and the clock signal generating circuit 8. The configurations of the functional blocks are the same as those of respective functional blocks in the first embodiment.

The video signal processing device 1 is configured by an ASIC in which these functional blocks are integrated and includes a plurality of registers 84 for an external controller to control the selection processing by the clock selecting portion 83.

Figure 8:
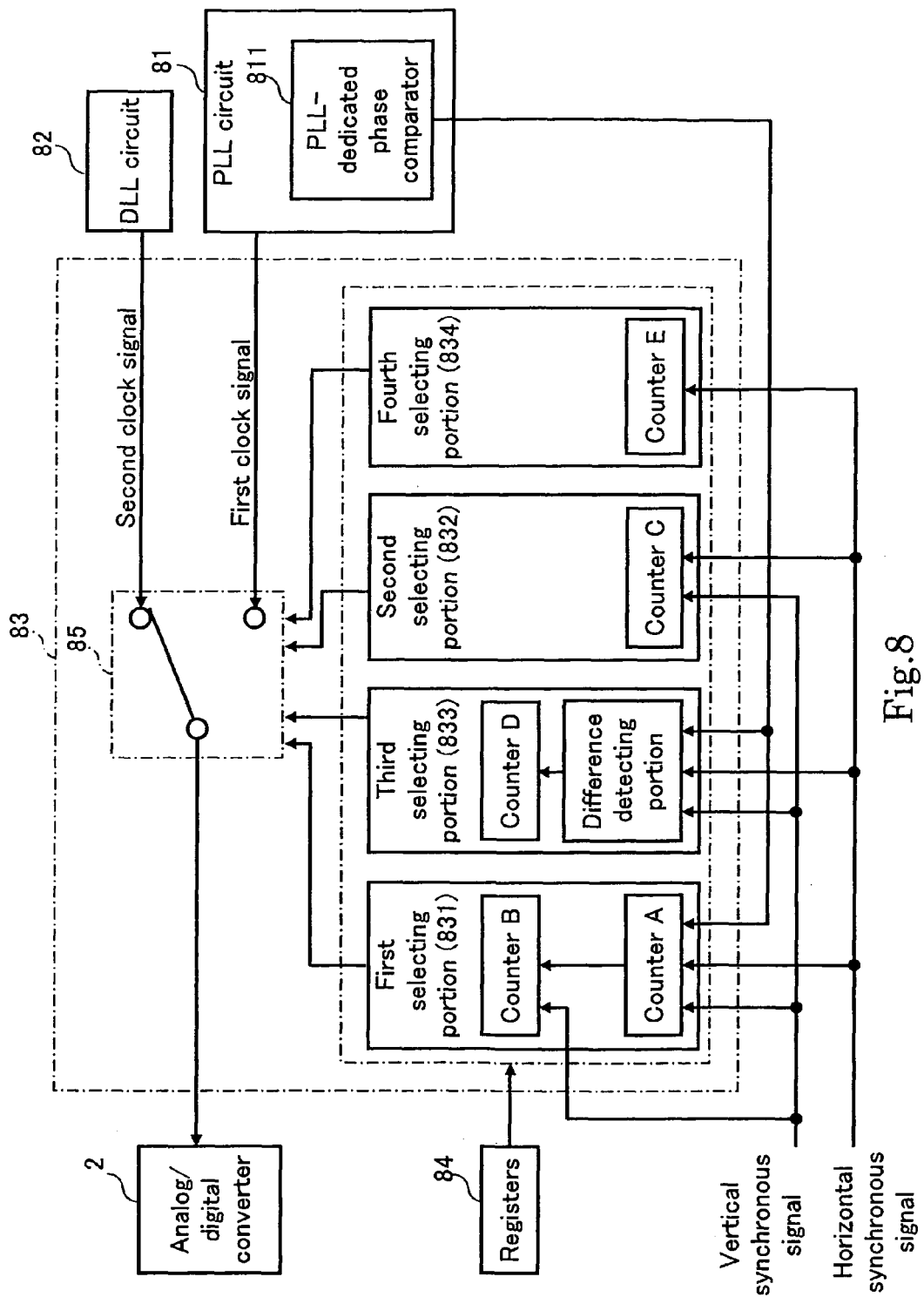
FIG. 8 is a functional block diagram of the clock selecting portion.

Referring to FIG. 8, the clock selecting portion 83 has mounted therein four selecting portions, namely a first selecting portion 831, a second selecting portion 832, a third selecting portion 833, and a fourth selecting portion 834, each of which is adapted to judge which clock signal to select in accordance with a reference value set in the registers 84.

Figure 9:
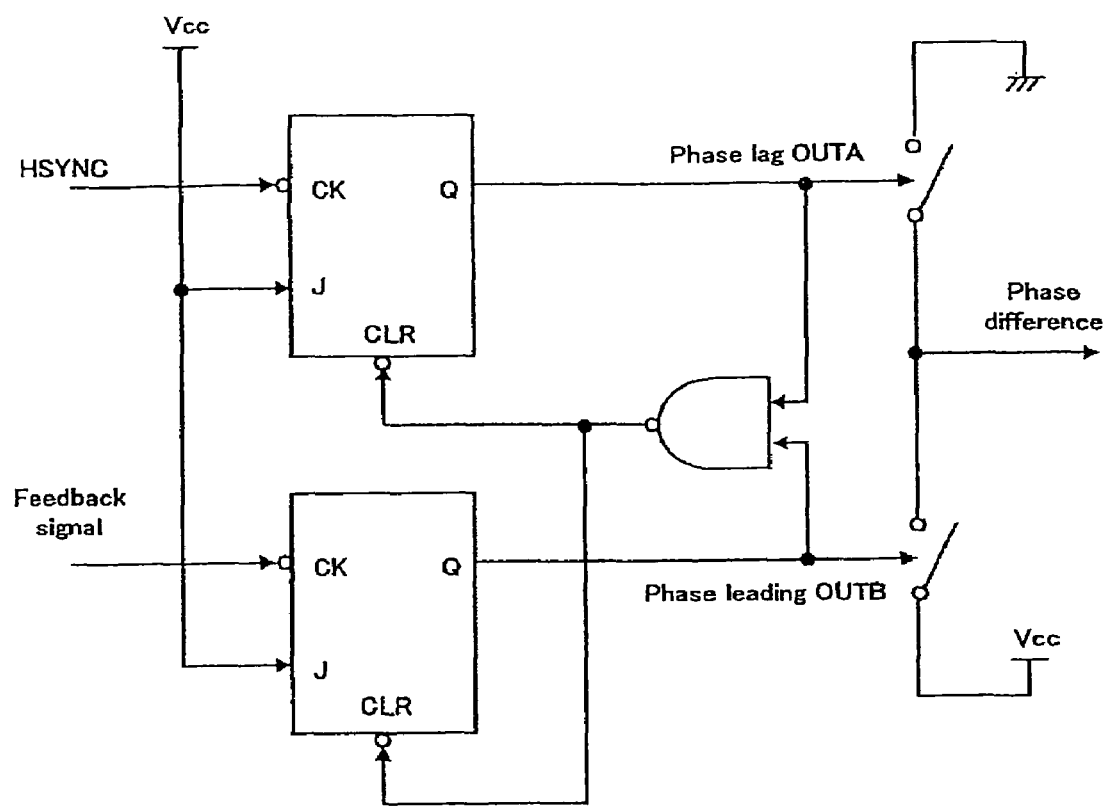
FIG. 9 is a circuit diagram of a PLL-dedicated phase comparator used in a PLL circuit.

First, description will be made of the PLL circuit 81 used in the present embodiment. Referring to FIG. 9, the PLL-dedicated phase comparator 811 includes a flip flop 811A for receiving at its clock terminal the input of a horizontal synchronous signal HSYNC output from the synchronous signal separating portion 7 and a flip flop 811B for receiving the input of a feedback signal divided by the frequency divider 814.

Outputs Q of the flip flop 811A and the flip flop 811B are input to a NAND gate 811C, and the output of the NAND gate 811C is input to clears CLR of the flip flop 811A and the flip flop 811B.

A switch 811D having one terminal grounded and a switch 811E having one terminal connected to the power source are connected in series. The switch 811D is switched on or off by the output Q of the flip flop 811A and the switch 811E is switched on or off by the output Q of the flip flop 811B.

When the phase of the feedback signal lags behind the horizontal synchronous signal HSYNC, the output Q of the flip flop 811A is turned into a high level for the lag period, thereby switching the switch 811D on.

When the phase of the feedback signal is ahead of the horizontal synchronous signal HSYNC, the output Q of the flip flop 811B is turned into a high level for the lead period, thereby switching the switch 811E on. The output Q of the flip flop 811A and the output Q of the flip flop 811B will be hereinafter referred to as a signal OUTA and a signal OUTB, respectively.

Hence, when the phase of the feedback signal lags behind the horizontal synchronous signal HSYNC, a low level signal is output as a lag-side phase difference from the connection point of the switch 811D and the switch 811E for the lag period, while when the phase of the feedback signal is ahead of the horizontal synchronous signal HSYNC, a high level signal is output as a lead-side phase difference from the connection point of the switch 811D and the switch 811E for the lead period.

The output of the PLL-dedicated phase comparator 811 is input to the VCO 813 through the LPF 812. The VCO 813 outputs to the frequency divider 814 a clock signal of a frequency increased or decreased from 27 MHz depending on the input phase difference.

The frequency divider 814 outputs as a feedback signal a clock signal divided at a dividing ratio of 1/(858×2) to the PLL-dedicated phase comparator 811.

Although the frequency of the horizontal synchronous signal HSYNC of the video signal of the NTSC system is set at 15.734 KHz, the frequency somewhat fluctuates in practice, and therefore, a sampling clock that secures synchronization of the horizontal frequency by the PLL circuit 81 must be used for AD conversion.

Figure 10:
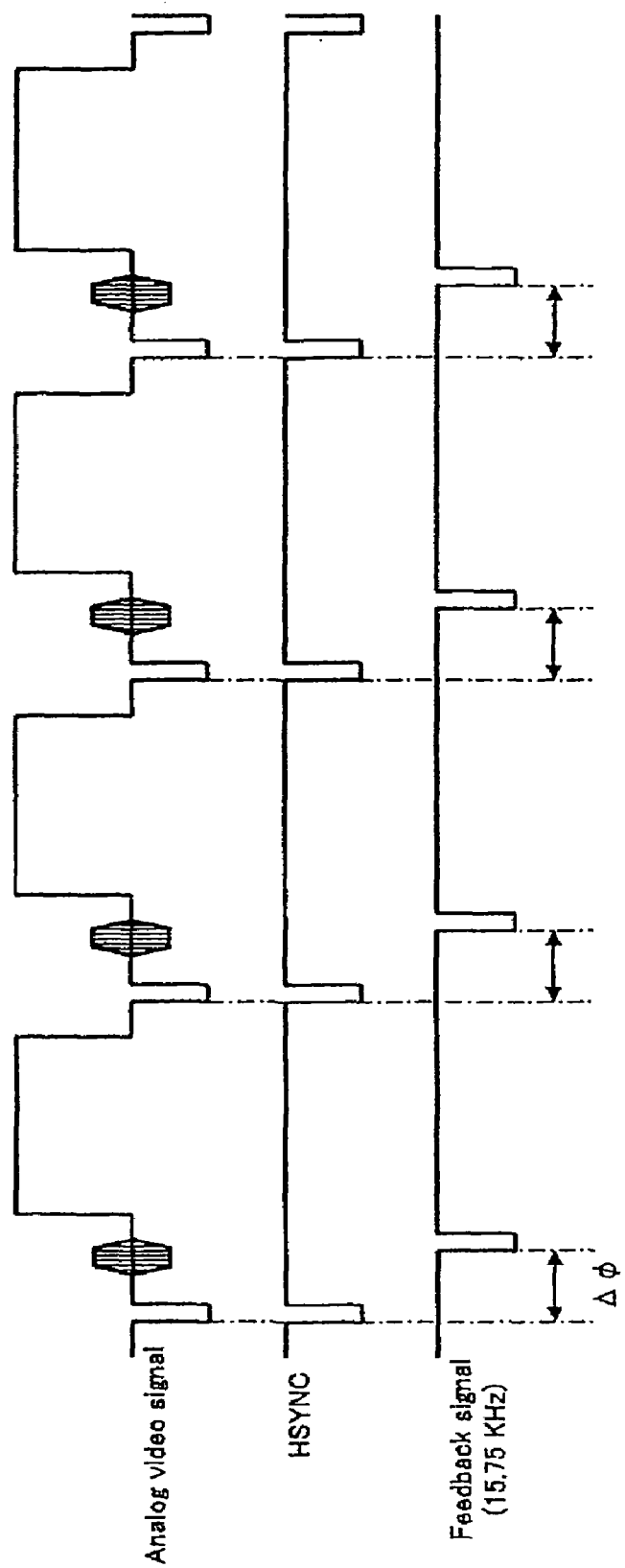
FIG. 10 is a diagram for illustrating a phase relation between a horizontal synchronous signal and a feedback signal.

However, if a phase difference $\Delta\phi$ between the horizontal synchronous signal HSYNC contained in the video signal and a feedback signal resulting from dividing the 27 MHz reference clock of the VCO 813 provided in the PLL circuit 81 increases as shown in FIG. 10, the synchronization is broken to result in a video distortion.

On the basis of the phase difference output from the PLL-dedicated phase comparator 811, that is, on the basis of the signal OUTA or the signal OUTB, the clock selecting portion 83 selects either the first clock signal, which is an output of the PLL circuit 81, or the second clock signal, which is an output of the DLL circuit 82, and outputs the selected signal to the analog/digital converter 2.

Description will be made of the selecting portions below. Referring to FIG. 8, the first selecting portion 831 includes a first horizontal synchronous signal counter (denoted as counter A in FIG. 8) for counting the number of horizontal synchronous signals each having a phase difference $\Delta\phi$ equal to or more than a reference phase difference, and a first field counter (denoted as counter B in FIG. 8) for counting the number of consecutive fields each having a value equal to or more than a first reference value indicated by the first horizontal synchronous signal counter.

When the first field counter indicates a value equal to or more than a first reference field value while the first clock signal is selected at the switching circuit 85, the first selecting portion 831 judges this case as an input of a non-standard signal deviating from the standard of the NTSC system and selects the second clock signal.

When the first field counter indicates a value equal to or less than the first reference field value while the second clock signal is selected at the switching circuit 85, the first selecting portion 831 judges this case as an input of a standard signal complying with the standard of the NTSC system and selects the first clock signal.

In the following description, the case where the first clock signal is selected will be referred to as a standard mode, and the case where the second clock signal is selected will be referred to as a non-standard mode.

Figure 11:
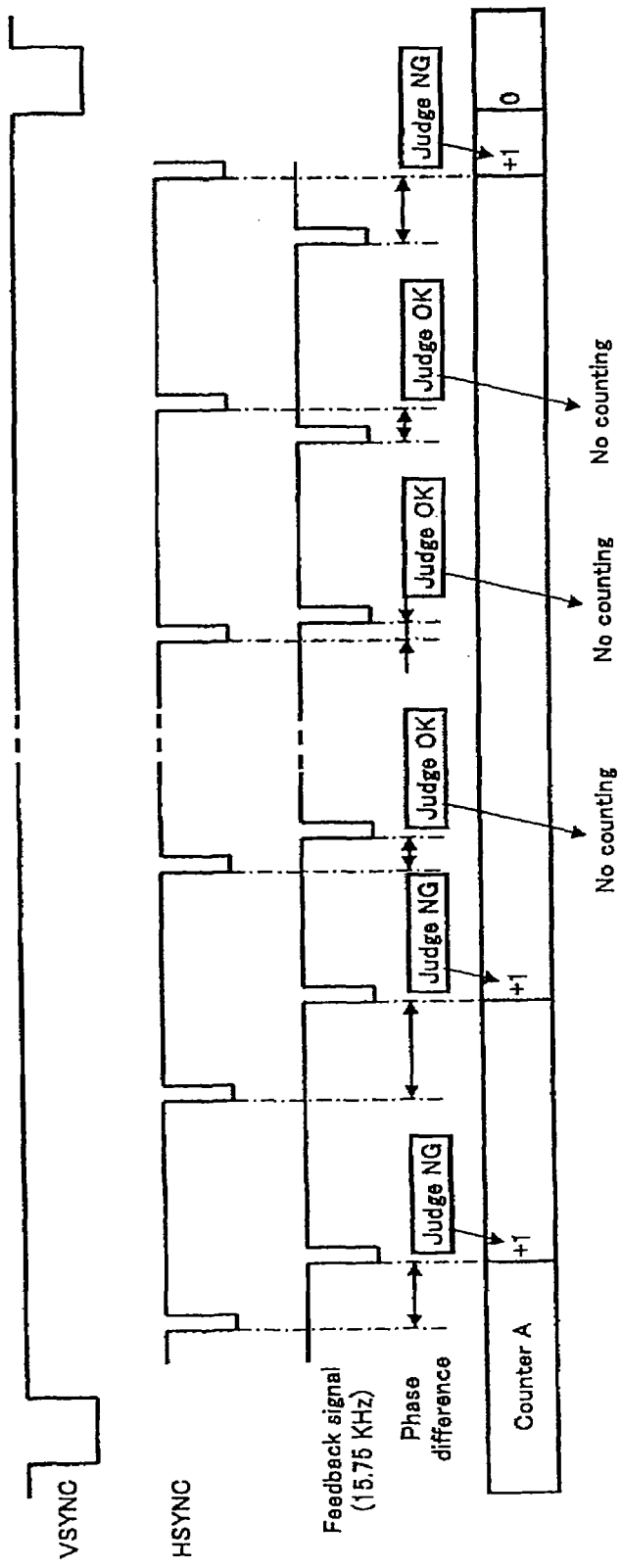
FIG. 11 is a diagram for illustrating the case where the phase is displaced to a lag side and the case where the phase is displaced to a lead side.
Figure 14:
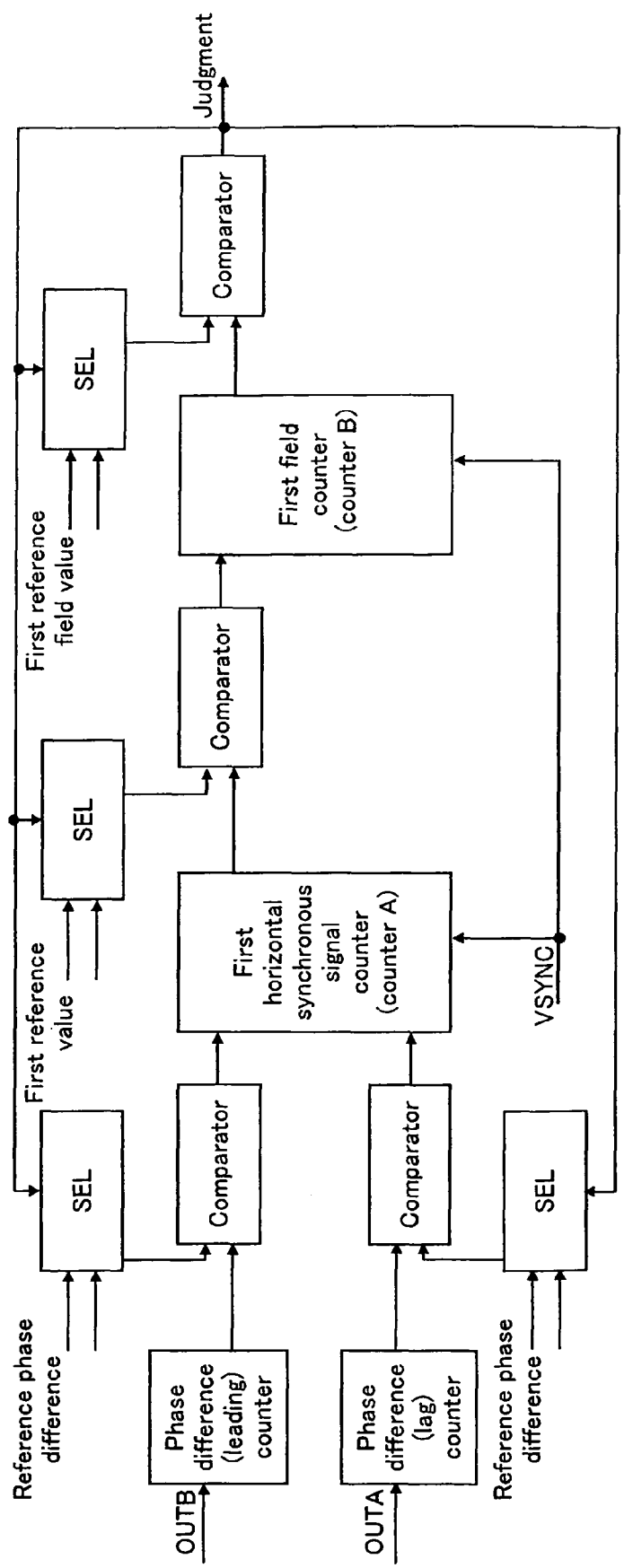
FIG. 14 is a circuit block diagram of the first selecting portion.

The first selecting portion 831 will be described in detail below. Referring to FIGS. 11 and 14, the first selecting portion 831 includes a phase difference counter for counting the high level periods of the signal OUTA with a clock of 54 MHz when the phase of the feedback signal lags behind the horizontal synchronous signal HSYNC on a field basis, and for counting the high level periods of the signal OUTB with a clock of 54 MHz when the phase of the feedback signal is ahead of the horizontal synchronous signal HSYNC.

The first selecting portion 831 includes a comparator for comparing, for each of the horizontal synchronous signals, the count by the phase difference counter and the reference phase difference set in the registers 84. When the count by the phase difference counter is equal to or more than the reference phase difference set in the registers 84, the first selecting portion 831 counts up the first horizontal synchronous signal counter (counter A).

Figure 12:
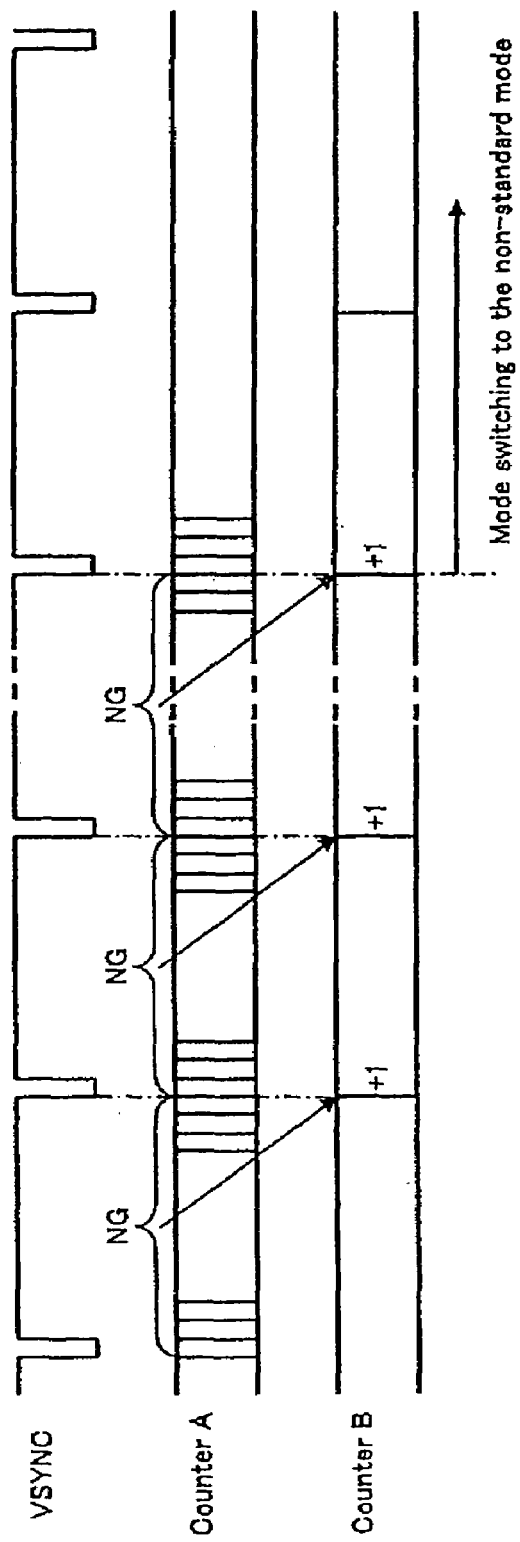
FIG. 12 is a diagram for illustrating the operation of a first selecting portion.

Referring to FIGS. 12 and 14, the first selecting portion 831 includes a comparator for comparing, when a vertical synchronous signal VSYNC is input, the count of the first horizontal synchronous signal counter and a first reference value set in the registers 84. When the value of the first horizontal synchronous signal counter is equal to or more than the first reference value, the first selecting portion 831 resets the first horizontal synchronous signal counter and counts up the first field counter (counter B).

When the vertical synchronous signal VSYNC is input while the count of the first horizontal synchronous signal counter is smaller than the first reference value, the first selecting portion 831 resets the first horizontal synchronous signal counter while at the same time resetting the first field counter.

Then, the first selecting portion 831 compares the value of the first field counter and a first reference field value using a comparator, and, on the basis of the result of the comparison, judges whether to select the first clock signal or the second clock signal.

When the first field counter indicates a value equal to or more than the first reference field value while the first clock signal is selected at the switching circuit 85, the first selecting portion 831 judges to switch to the second clock signal, while when the first field counter indicates a value smaller than the first reference field value, the first selecting portion 831 judges to keep the first clock signal selected.

When the first field counter indicates a value equal to or less than the first reference field value while the second clock signal is selected at the switching circuit 85, the first selecting portion 831 judges to switch to the first clock signal, while when the first field counter indicates a value more than the first reference field value, the first selecting portion 831 judges to keep the second clock signal selected.

The reference phase difference set in the registers 84 may be set identically for the phase lead side and the phase lag side, and preferably, the reference phase difference is set differently. This is for the purpose of improving the responsiveness of switching between the standard mode and the non-standard mode, since the recording media such as video tapes used in the playback operation of the video cassette recorder vary their properties depending on their states.

That is, it is preferable to set differently a reference phase difference $\phi 1$ for transition to the non-standard mode due to a phase lag while the standard mode is selected and a reference phase difference $\phi 2$ for transition to the non-standard mode due to a phase lead while the standard mode is selected.

It is also preferable to set the reference phase difference, the first reference value, and the first reference field value differently depending on the case where the first clock signal is selected and the case where the second clock signal is selected. The reference phase difference may be set within the range between more than 0 and several micro seconds, the first reference value may be set within the range between more than 0 and 255 lines, and the first reference field value may be set within the range between more than 0 and 255 fields.

Figure 13:
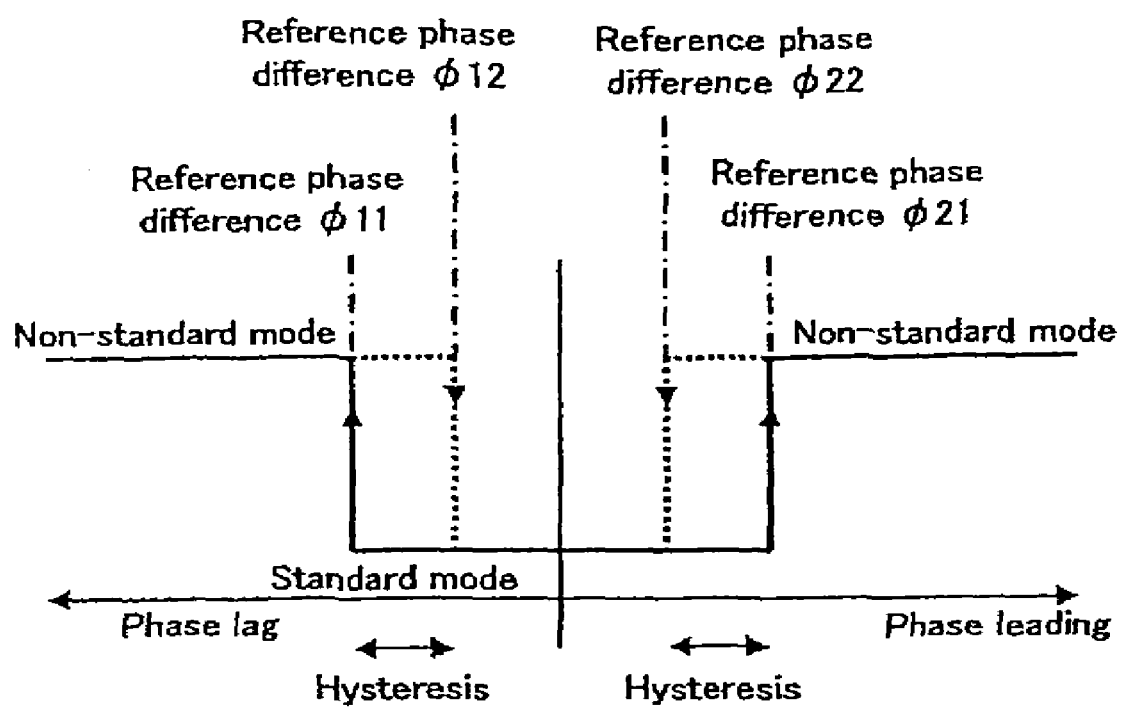
FIG. 13 is a diagram for illustrating a reference phase difference value set in registers.

Referring to FIG. 13, it is preferable to set differently a reference phase difference $\phi 11$ for transition to the non-standard mode due to a phase lag while the standard mode is selected and a reference phase difference $\phi 12$ for transition to the standard mode due to a reduction in phase lag while the non-standard mode is selected.

It is also preferable to set differently a reference phase difference $\phi 21$ for transition to the non-standard mode due to a phase lead while the standard mode is selected and a reference phase difference $\phi 22$ for transition to the standard mode due to a reduction in phase lead while the non-standard mode is selected.

This is for the purpose of providing a hysteresis in order to prevent video distortion caused by frequent switching between the standard mode and the non-standard mode.

Likewise, the first reference value and the first reference field value in the case of the transition from the standard mode to the non-standard mode are preferably set differently from the first reference value and the first reference field value in the case of the transition from the non-standard mode to the standard mode, thereby providing a hysteresis.

FIG. 14 is a circuit configuration of the first selecting portion 831 in the case of different reference phase differences, different first reference values, and different first reference field values set in the resisters.

According to the NTSC system, the number of horizontal synchronous signals constituting one field, that is, the number of scanning lines is 262.5.

However, if there is a deficiency of lines, the first selecting portion 831 may not be able to judge correctly depending on the first reference value set in the registers.

In view of this, the clock selecting portion 83 preferably includes the second selecting portion 832 in addition to the first selecting portion 831.

Figure 15:
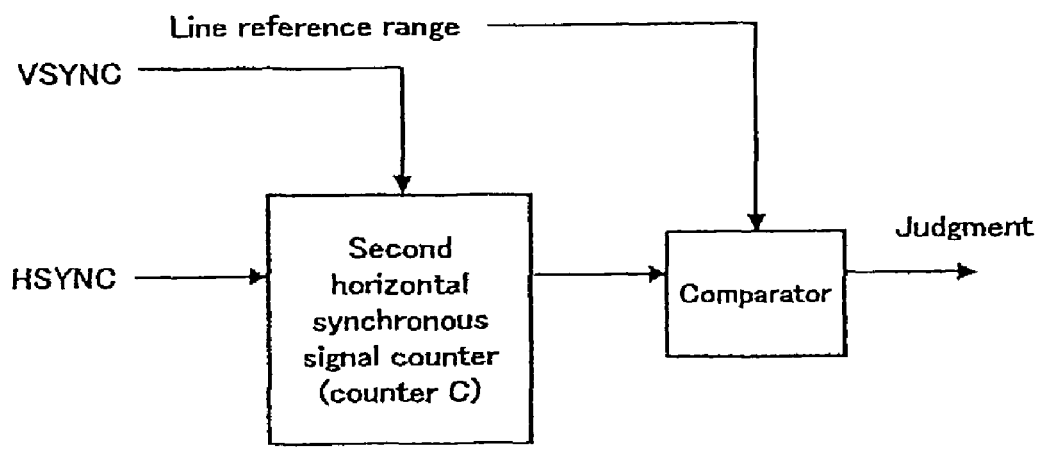
FIG. 15 is a circuit block diagram of a second selecting portion.

Referring to FIGS. 8 and 15, the second selecting portion 832 includes a second horizontal synchronous signal counter (denoted as counter C in FIG. 8) for counting, in synchronism with the vertical synchronous signal VSYNC, the number of horizontal synchronous signals HSYNC contained in each field, and a comparator for comparing the value of the second horizontal synchronous signal counter and a line reference range set in the registers 84. The line reference range may be set within the range of 262.5±2.5 lines.

When the second horizontal synchronous signal counter indicates a value deviating from the line reference range set in the registers 84 while the first clock signal is selected, the second selecting portion 832 judges to switch to the second clock signal, while when the value of the second horizontal synchronous signal counter is within the line reference range, the second selecting portion 832 judges to keep the first clock signal selected.

When the second horizontal synchronous signal counter indicates a value encompassed within the line reference range set in the registers 84 while the second clock signal is selected, the second selecting portion 832 judges to switch to the first clock signal, while when the value of the second horizontal synchronous signal counter deviates from the line reference range, the second selecting portion 832 judges to keep the second clock signal selected.

Referring to FIG. 8, the third selecting portion 833 includes a difference detecting portion for calculating a difference value between a maximum value and a minimum value of the phase difference $\Delta\phi$ with respect to a plurality of consecutive horizontal synchronous signals within a predetermined section of one field, and a second field counter (denoted as counter D in FIG. 8) for counting the number of consecutive field blocks where the difference value is equal to or more than a reference difference value or equal to or less than the reference difference value.

While the first clock signal is selected at the switching circuit 85, the third selecting portion 833 counts with the second field counter the number of consecutive field blocks where the difference value is more than the reference difference value, the number of consecutive field blocks being within a second reference field value, and when the second field counter indicates a value equal to a reference field block number, the third selecting portion 833 judges this case as an input of a non-standard signal deviating from the standard of the NTSC system and selects the second clock signal.

While the second clock signal is selected at the switching circuit 85, the third selecting portion 833 counts with the second field counter the number of consecutive field blocks where the difference value is less than the reference difference value, the number of consecutive field blocks being within the second reference field value, and when the second field counter indicates a value equal to the reference field block number, the third selecting portion 833 judges this case as an input of a standard signal complying with the standard of the NTSC system and selects the first clock signal.

Figure 16:
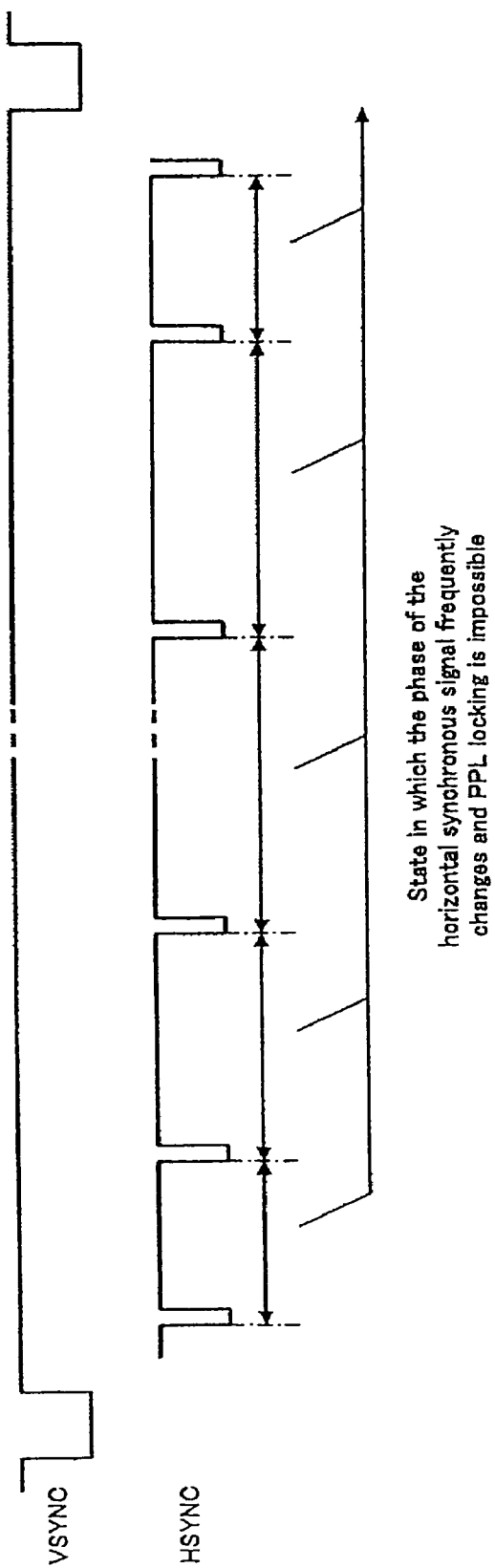
FIG. 16 is a diagram for illustrating the operation of a third selecting portion.

Referring to FIG. 16, the third selecting portion 833 is provided to deal with the case where the period of the horizontal synchronous signal of the analog video signal frequently changes ending up in the state where the phase locking by the PLL circuit 81 is impossible.

This is useful in the case where, for example, the phase difference frequently changes within the range of hysteresis as shown in FIG. 13.

Figure 17:
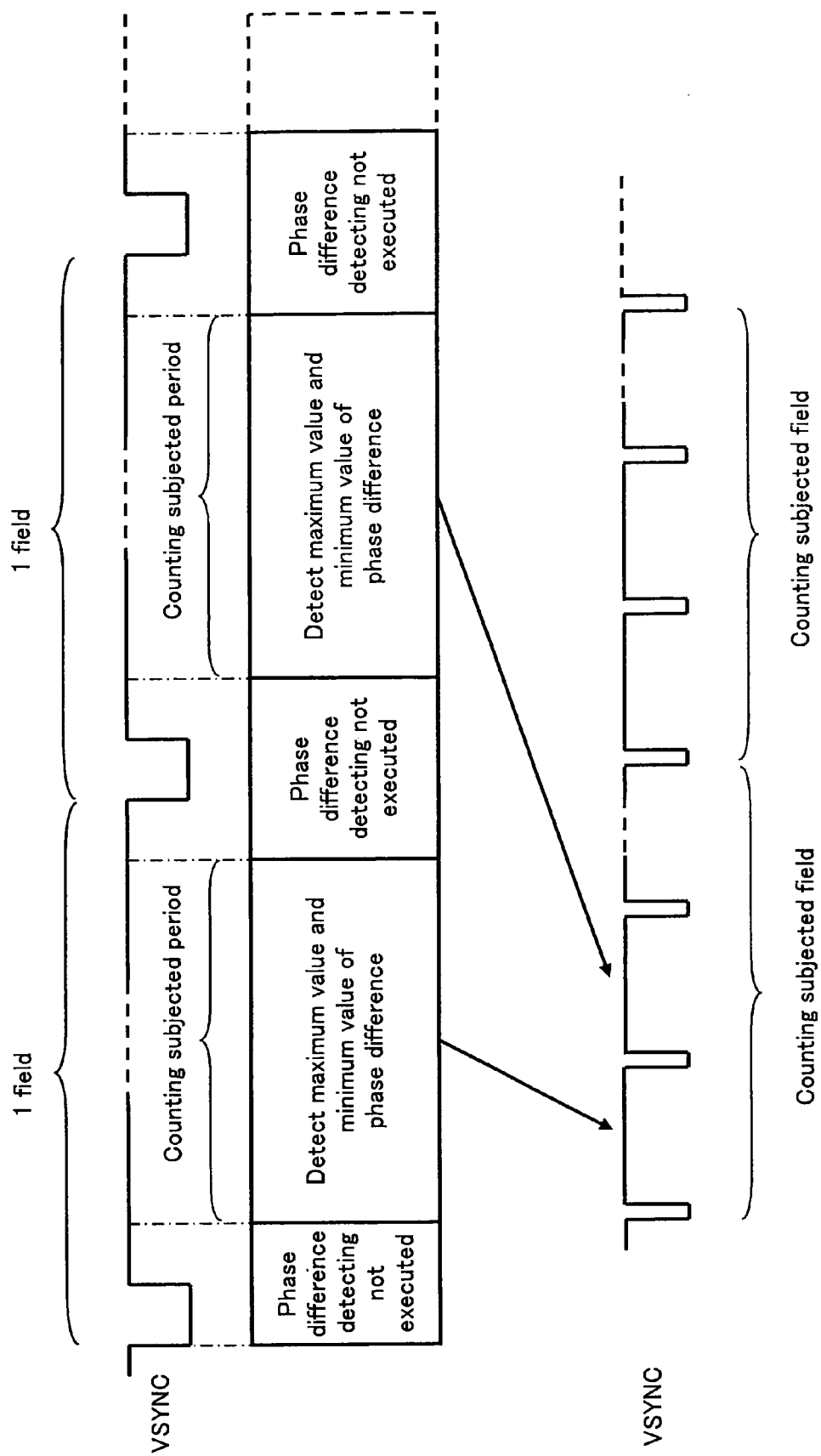
FIG. 17 is a diagram for illustrating the operation of the third selecting portion.
Figure 18:
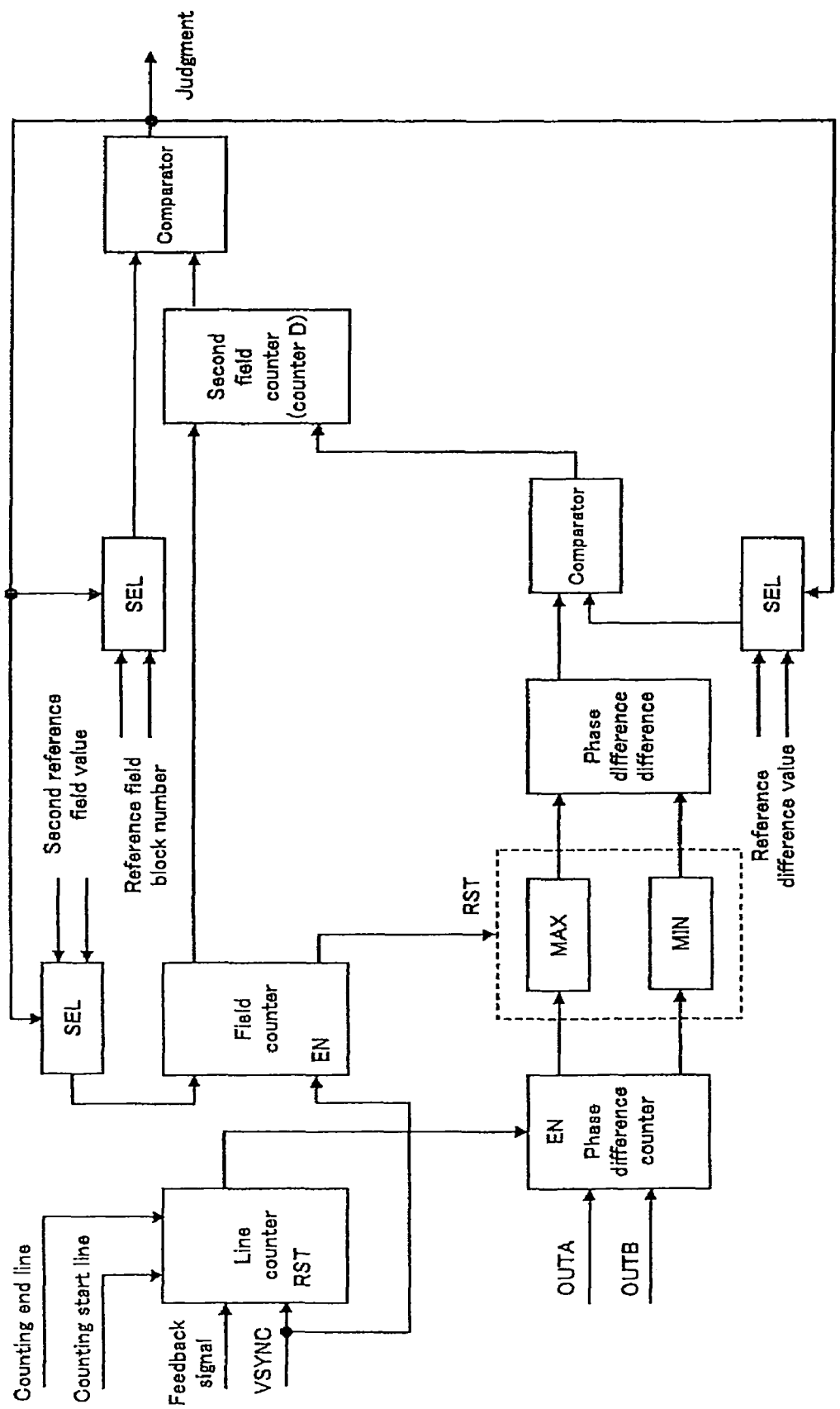
FIG. 18 is a circuit block diagram of the third selecting portion.

The third selecting portion 833 will be described in detail below. Referring to FIGS. 17 and 18, the third selecting portion 833 includes a phase difference counter for counting for counting the high level periods of the signal OUTA with a clock of 54 MHz when the phase of the feedback signal lags behind the horizontal synchronous signal HSYNC, and for counting the high level periods of the signal OUTB with a clock of 54 MHz when the phase of the feedback signal is ahead of the horizontal synchronous signal HSYNC.

The registers 84 set therein a period of the horizontal synchronous signal HSYNC subjected to the phase difference $\Delta\phi$ counting, that is, a counting subjected period.

The counting subjected period is set in a middle period of a field, resulting from excluding the front and the rear periods of input of the vertical synchronous signal VSYNC, and is defined by a counting start line and a counting end line.

The third selecting portion 833 counts the phase differences $\Delta\phi$ in the counting subjected period of each of the input horizontal synchronous signals HSYNC, and writes a maximum value of the counted phase difference $\Delta\phi$ in a maximum register while writing a minimum value of the counted phase difference $\Delta\phi$ in a minimum register.

The value of the maximum register and the value of the minimum register are updated constantly until the number of the fields reaches the second reference field value, which is set in the registers 84.

Every time the field number counted by the field counter reaches the second reference field value, the third selecting portion 833 calculates, in the vertical blanking interval, a difference value between the maximum value written in the maximum register and the minimum value written in the minimum register, and compares with a comparator this difference value and a reference difference value set in the registers 84.

When the difference value is equal to or more than the reference difference value while the first clock signal is selected at the switching circuit 85, the third selecting portion 833 counts up the second field counter.

The third selecting portion 833 resets the maximum register and the minimum register upon detecting through the field counter, which counts the field number, that the field number has reached the reference field block number set in the registers 84.

Here, the third selecting portion 833 also compares with a comparator the value of the second field counter and the reference field block number to see whether they are equal to one another. When they are equal, the third selecting portion 833 judges to switch to the second clock signal, and otherwise judges to keep the first clock signal selected.

When the difference value is equal to or less than the reference difference value while the second clock signal is selected at the switching circuit 85, the third selecting portion 833 counts up the second field counter.

The third selecting portion 833 resets the maximum register and the minimum register upon detecting through the field counter, which counts the field number, that the field number has reached the reference field block number set in the registers 84.

Here, the third selecting portion 833 also compares with a comparator the value of the second field counter and the reference field block number to see whether they are equal to one another. When they are equal, the third selecting portion 833 judges to switch to the first clock signal, and otherwise judges to keep the second clock signal selected.

Similarly to the value of the registers associated with the first selecting portion 831, it is also preferable to set the reference difference value, the second reference field value, and the reference field block number differently depending on the case where the first clock signal is selected and the case where the second clock signal is selected. The reference difference value may be set within the range between more than 0 and several micro seconds, the second reference field value may be set within the range between more than 0 and 255 fields, and the reference field block number may be set within the range between more than 0 and 255.

Referring to FIG. 8, the fourth selecting portion 834 includes a third horizontal synchronous signal counter (denoted as counter E in FIG. 8) for counting, on a field basis, the number of horizontal synchronous signals HSYNC having periods deviating from a tolerated range set in the registers 84 with respect to horizontal synchronous signals HSYNC separated from composite synchronous signals CSYNC.

When the third horizontal synchronous signal counter indicates a value equal to or more than a reference signal number set in the registers 84 within one field while the first clock signal is selected, the fourth selecting portion 834 judges this case as an input of a non-standard signal deviating from the standard of the NTSC system and selects the second clock signal.

When the third horizontal synchronous signal counter indicates a value equal to or less than the reference signal number set in the registers 84 within one field while the second clock signal is selected, the fourth selecting portion 834 judges this case as an input of a standard signal complying with the standard of the NTSC system and selects the first clock signal.

The fourth selecting portion 834 is provided to deal with the case where the period of the horizontal synchronous signal of the analog video signal changes in a large degree.

Figure 19:
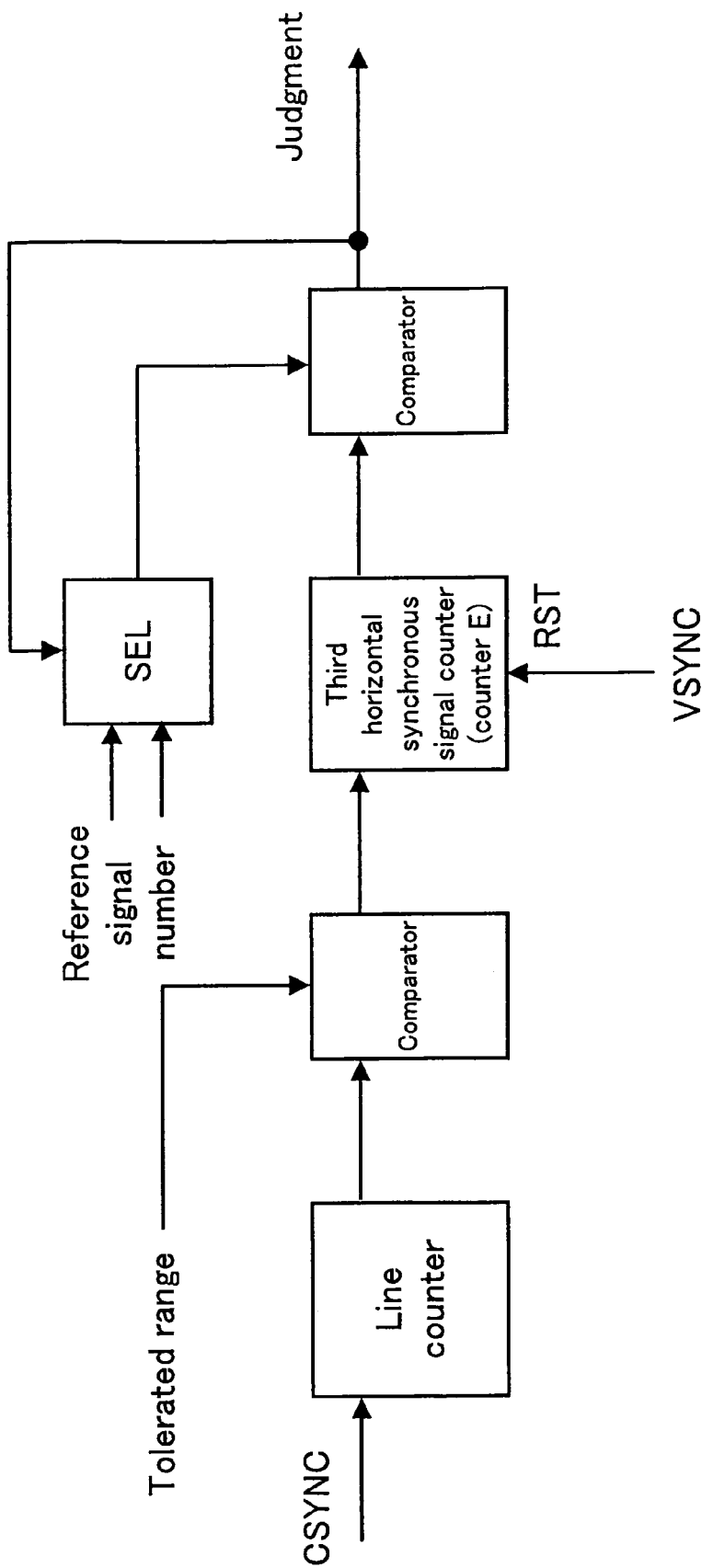
FIG. 19 is a circuit block diagram of a fourth selecting portion.

The fourth selecting portion 834 will be described in detail below. Referring to FIG. 19, the fourth selecting portion 834 includes a line counter for detecting a horizontal synchronous signal component from the composite synchronous signal CSYNC separated by the synchronous signal separating portion 7 and for counting horizontal synchronous periods each between two horizontal synchronous signals with a clock of 54 MHz.

When the periods of the horizontal synchronous signals are proper, the number of the horizontal synchronous periods counted is 1716×2(=3432), while when the periods fluctuate, the counted value varies.

At each of the horizontal synchronous timings, the fourth selecting portion 834 compares with a comparator the value of the line counter and the tolerated range set in the registers 84 to see whether the value of the line counter deviates from the tolerated range. When the value of the line counter deviates from the tolerated range, the fourth selecting portion 834 counts up the third horizontal synchronous signal counter.

While the first clock signal is selected, the fourth selecting portion 834 compares with a comparator the value of the third horizontal synchronous signal counter and a reference signal number set in the registers 84 at a vertical horizontal timing. When the value of the third horizontal synchronous signal counter is equal to or more than the reference signal number, the fourth selecting portion 834 judges to switch to the second clock signal.

While the second clock signal is selected, the fourth selecting portion 834 compares with a comparator the value of the third horizontal synchronous signal counter and the reference signal number set in the registers 84 at a vertical horizontal timing. When the value of the third horizontal synchronous signal counter is equal to or less than the reference signal number, the fourth selecting portion 834 judges to switch to the first clock signal.

It is preferable to set the tolerated range and the reference signal number set in the resisters differently depending on the case where the first clock signal is selected and the case where the second clock signal is selected. The tolerated range may be set in the range of 3432±3 times, and the reference signal number may be approximately twenty percent of the number of scanning lines in one field in the case where the first clock signal is selected and approximately ten percent of the number of scanning lines in one field in the case where the second clock signal is selected.

While the second embodiment describes the example where the clock selecting portion 83 mounts therein four selecting portions, namely the first selecting portion 831, the second selecting portion 832, the third selecting portion 833, and the fourth selecting portion 834, it is possible to mount any one of the first selecting portion 831, the second selecting portion 832, the third selecting portion 833, and the fourth selecting portion 834.

When the clock selecting portion 83 mounts therein all the four selecting portions or some of them, the configuration is preferably as follows.

When any one of the first selecting portion 831, the second selecting portion 832, the third selecting portion 833, and the fourth selecting portion 834 selects the second clock signal while the first clock signal is selected at the switching circuit 85, the clock selecting portion 83 causes the switching circuit 85 to switch to the second clock signal.

This is because when mutually different judgments are output, the digital conversion of the video signal with the second clock signal, which is output from the DLL circuit 82, provides a higher possibility of preventing a video distortion.

Contrarily, only when the first to four selecting portions 831 to 834 all select the first clock signal while the second clock signal is selected at the switching circuit 85, the clock selecting portion 83 causes the switching circuit 85 to switch to the first clock signal.

This is because when all the judgments agree, the digital conversion of the video signal with the first clock signal, which is output from the PLL circuit 81, results in a beautiful video display without video distortion.

The above embodiments have been described by way of example; it will be appreciated that various modifications can be made to the specific details of the blocks without departing from the scope of the present invention.

What is claimed is:

1. A video signal processing device comprising:
   a Phase-Locked Loop (PLL) circuit for generating a first clock signal on the basis of a horizontal synchronous signal acquired from an analog video signal;
   a Delay-Locked Loop (DLL) circuit for generating a second clock signal on the basis of a composite synchronous signal acquired from the analog video signal;
   a clock selecting portion for selecting and outputting the first clock signal when a phase difference output from a PLL-dedicated phase comparator provided in the PLL circuit is less than a predetermined reference phase difference, and selecting and outputting the second clock signal when the phase difference is equal to or more than the predetermined reference phase difference; and
   an analog/digital converter for converting the analog video signal into a digital video signal on the basis of the clock signal selected by the clock selecting portion.

2. The video signal processing device according to claim 1, wherein:
   the clock selecting portion mounts therein a first selecting portion including:
   a first horizontal synchronous signal counter for counting the number of horizontal synchronous signals each having a phase difference equal to or more than the predetermined reference phase difference; and
   a first field counter for counting the number of consecutive fields each having a value equal to or more than a first reference value indicated by the first horizontal synchronous signal counter;
   when the first field counter indicates a value equal to or more than a first reference field value while the first clock signal is selected, the first selecting portion selects the second clock signal; and
   when the first field counter indicates a value equal to or less than the first reference field value while the second clock signal is selected, the first selecting portion selects the first clock signal.

3. The video signal processing device according to claim 2, wherein:
   the clock selecting portion mounts therein a second selecting portion including a second horizontal synchronous signal counter for counting the number of horizontal synchronous signals included in each of the fields;
   when the second horizontal synchronous signal counter indicates a value deviating from a line reference range while the first clock signal is selected, the second selecting portion selects the second clock signal; and
   when the second horizontal synchronous signal counter indicates a value encompassed within the line reference range while the second clock signal is selected, the second selecting portion selects the first clock signal.

4. The video signal processing device according to claim 1, wherein:
   the clock selecting portion mounts therein a third selecting portion including a second field counter for calculating a difference value between a maximum value and a minimum value of the phase difference with respect to a plurality of consecutive horizontal synchronous signals within a predetermined section of one field, and for counting the number of consecutive field blocks where the difference value is equal to or more than a reference difference value or equal to or less than the reference difference value, the number of consecutive field blocks being within a second reference field value;
   while the first clock signal is selected, the third selecting portion counts with the second field counter the number of consecutive field blocks where the difference value is more than the reference difference value, the number of consecutive field blocks being within the second reference field value, and when the second field counter indicates a value equal to a reference field block number, the third selecting portion selects the second clock signal; and
   while the second clock signal is selected, the third selecting portion counts with the second field counter the number of consecutive field blocks where the difference value is less than the reference difference value, the number of consecutive field blocks being within the second reference field value, and when the second field counter indicates a value equal to the reference field block number, the third selecting portion selects the first clock signal.

5. The video signal processing device according to claim 1, wherein:
   the clock selecting portion mounts therein a fourth selecting portion including a third horizontal synchronous signal counter for counting, on a field basis, the number of horizontal synchronous signals having periods deviating from a tolerated range with respect to horizontal synchronous signals separated from composite synchronous signals;
   when the third horizontal synchronous signal counter indicates a value equal to or more than a reference signal number within one field while the first clock signal is selected, the fourth selecting portion selects the second clock signal; and when the third horizontal synchronous signal counter indicates a value equal to or less than the reference signal number within one field while the second clock signal is selected, the fourth selecting portion selects the first clock signal.

6. The video signal processing device according to claim 1, wherein:

the clock selecting portion includes:
a first selecting portion including:
a first horizontal synchronous signal counter for counting the number of horizontal synchronous signals each having a phase difference equal to or more than the predetermined reference phase difference; and
a first field counter for counting the number of consecutive fields each having a value equal to or more than a first reference value indicated by the first horizontal synchronous signal counter;
when the first field counter indicates a value equal to or more than a first reference field value while the first clock signal is selected, the first selecting portion selects the second clock signal; and
when the first field counter indicates a value equal to or less than the first reference field value while the second clock signal is selected, the first selecting portion selects the first clock signal;
a second selecting portion including:
a second horizontal synchronous signal counter for counting the number of horizontal synchronous signals included in each of the fields;
when the second horizontal synchronous signal counter indicates a value deviating from a line reference range while the first clock signal is selected, the second selecting portion selects the second clock signal; and
when the second horizontal synchronous signal counter indicates a value encompassed within the line reference range while the second clock signal is selected, the second selecting portion selects the first clock signal;
a third selecting portion including:
a second field counter for calculating a difference value between a maximum value and a minimum value of the phase difference with respect to a plurality of consecutive horizontal synchronous signals within a predetermined section of one field, and for counting the number of consecutive field blocks where the difference value is equal to or more than a reference difference value or equal to or less than the reference difference value, the number of consecutive field blocks being within a second reference field value;
while the first clock signal is selected, the third selecting portion counts with the second field counter the number of consecutive field blocks where the difference value is more than the reference difference value, the number of consecutive field blocks being within the second reference field value, and when the second field counter indicates a value equal to a reference field block number, the third selecting portion selects the second clock signal; and
while the second clock signal is selected, the third selecting portion counts with the second field counter the number of consecutive field blocks where the difference value is less than the reference difference value, the number of consecutive field blocks being within the second reference field value, and when the second field counter indicates a value equal to the reference field block number, the third selecting portion selects the first clock signal; and
a fourth selecting portion including:
a third horizontal synchronous signal counter for counting, on a field basis, the number of horizontal synchronous signals having periods deviating from a tolerated range with respect to horizontal synchronous signals separated from composite synchronous signals;
when the third horizontal synchronous signal counter indicates a value equal to or more than a reference signal number within one field while the first clock signal is selected, the fourth selecting portion selects the second clock signal; and
when the third horizontal synchronous signal counter indicates a value equal to or less than the reference signal number within one field while the second clock signal is selected, the fourth selecting portion selects the first clock signal;
when any one of the first to fourth selecting portions selects the second clock signal while the first clock signal is selected, the clock selecting portion selects the second clock signal; and
only when all the first to fourth selecting portions select the first clock signal while the first clock signal is selected, the clock selecting portion selects the first clock signal.

7. The video signal processing device according to claim 1, wherein:
when a predetermined number of horizontal synchronous signals each having a phase difference equal to or more than a first threshold value exist consecutively, the clock selecting portion selects the second clock signal; and
when a predetermined number of horizontal synchronous signals each having a phase difference equal to or less than a second threshold value smaller than the first threshold value exist consecutively, the clock selecting portion selects the first clock signal.

8. The video signal processing device according to claim 1, wherein the DLL circuit includes:
a plurality of clock delay circuits each for delaying the first clock signal for a different period of time;
a Delay-Locked Loop (DLL)-dedicated phase comparator for carrying out phase comparison between output of the clock delay circuits and the composite synchronous signal; and
a clock switching portion for outputting, as the second clock signal, output of a clock delay circuit of a minimum phase difference indicated by the DLL-dedicated phase comparator.

* * * * *